US009648726B2

(12) United States Patent
Ichinose et al.

(10) Patent No.: US 9,648,726 B2
(45) Date of Patent: *May 9, 2017

(54) SUSPENSION BOARD ASSEMBLY SHEET WITH CIRCUITS AND MANUFACTURING METHOD OF THE SAME

(71) Applicant: Nitto Denko Corporation, Osaka (JP)

(72) Inventors: Kouji Ichinose, Osaka (JP); Terukazu Ihara, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 192 days.

This patent is subject to a terminal disclaimer.

(21) Appl. No.: 14/565,552

(22) Filed: Dec. 10, 2014

(65) Prior Publication Data

US 2015/0181695 A1    Jun. 25, 2015

(30) Foreign Application Priority Data

Dec. 19, 2013    (JP) .................................. 2013-262785

(51) Int. Cl.
| H05K 1/11 | (2006.01) |
| H05K 1/14 | (2006.01) |
| H05K 1/02 | (2006.01) |
| H05K 3/00 | (2006.01) |

(Continued)

(52) U.S. Cl.
CPC ......... *H05K 1/0268* (2013.01); *H05K 3/0097* (2013.01); *G01R 31/2818* (2013.01); *H05K 1/056* (2013.01); *Y10T 29/49165* (2015.01)

(58) Field of Classification Search
USPC .................................................. 361/784, 748
See application file for complete search history.

(56) References Cited

U.S. PATENT DOCUMENTS 6,552,914 B1 *   4/2003   Chang ................... H05K 7/142
                                                         361/740
2010/0116540 A1   5/2010   Ishii et al.
2012/0152592 A1   6/2012   Ishii
(Continued)

FOREIGN PATENT DOCUMENTS

JP   2010-135754 A   6/2010
JP   2012-018984 A   1/2012
(Continued)

OTHER PUBLICATIONS

Office Action issued Mar. 7, 2017 in JP Application No. 2013-262785.

*Primary Examiner* — Andargie M Aychillhum
(74) *Attorney, Agent, or Firm* — Panitch Schwarze Belisario & Nadel LLP

(57) ABSTRACT

A plurality of suspension boards are integrally supported by a support frame. A plurality of inspection substrates are provided to correspond to the plurality of suspension boards. In each suspension board, lines are formed on a conductive support substrate with a base insulating layer sandwiched therebetween. The support substrate and the line are electrically connected by a via in the base insulating layer. In each inspection substrate, a conductor layer is formed on a conductive support substrate with a base insulating layer sandwiched therebetween. The support substrate and the conductor layer are electrically connected by a via in the base insulating layer.

10 Claims, 18 Drawing Sheets

(51) Int. Cl.
*H05K 1/05* (2006.01)
*G01R 31/28* (2006.01)

(56) References Cited

U.S. PATENT DOCUMENTS

2014/0126169 A1   5/2014   Ihara et al.
2014/0177106 A1*  6/2014   Shirafuji ................ G11B 5/486
                                                              360/245.9

FOREIGN PATENT DOCUMENTS

JP   2012134197 A   7/2012
JP   2014-096423 A  5/2014

\* cited by examiner

F I G. 1 8
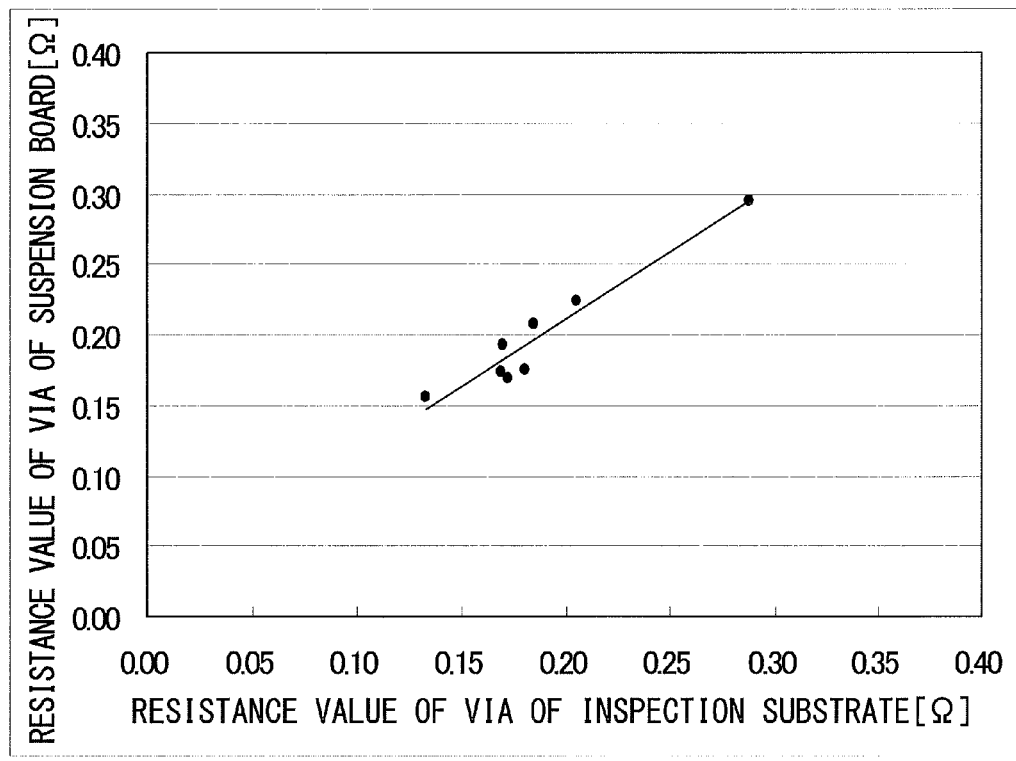

SUSPENSION BOARD ASSEMBLY SHEET WITH CIRCUITS AND MANUFACTURING METHOD OF THE SAME

BACKGROUND OF THE INVENTION

Field of the Invention

The present invention relates to a suspension board assembly sheet with circuits and a manufacturing method of the suspension board assembly sheet with circuits.

Description of Related Art

Actuators are used in drives such as hard disc drives. Such an actuator includes an arm provided rotatably around a rotation shaft, and a suspension board with a circuit (hereinafter referred to as a suspension board) for a magnetic head that is attached to the arm. The suspension board is a printed circuit board for positioning the magnetic head at a desired track of a magnetic disc.

The suspension board includes the magnetic head and is connected to another electronic circuit. A conductor trace is formed at the suspension board, and an electric signal is transmitted between another electronic circuit and the magnetic head through the conductor trace. The plurality of suspension boards having such configuration are formed to be integrally supported at a common support frame in the manufacturing process (see JP 2012-18984 A, for example).

In each suspension board, a ground wiring layer and a signal wiring layer are formed on a metallic support substrate with an insulating layer sandwiched therebetween. The ground wiring layer and a metallic support substrate are electrically connected by a plated via portion that penetrates the insulating layer. Further, in the support frame, a conductor layer is formed on the metallic support substrate with the insulating layer sandwiched therebetween.

BRIEF SUMMARY OF THE INVENTION

In JP 2012-18984 A, a substrate for suspension with a support frame having an inspecting plated via portion at the support frame is described. According to JP 2012-18984 A, it is possible to perform inspection of plated via portions of a plurality of suspension boards by performing inspection of the inspecting plated via portion at the support frame without directly respectively inspecting the plated via portions of the plurality of suspension boards. Thus, a time period for inspection of the plated via portions of the plurality of suspension boards is shortened. However, the state of the inspecting plated via portion and the state of the plated via portion of each suspension board described in JP 2012-18984 A do not necessarily have a high correlation. Therefore, reliability of the inspection result is low.

An object of the present invention is to provide a suspension board assembly sheet with circuits in which inspection of vias of a plurality of suspension boards can be performed in a short period of time and reliability of an inspection result can be improved, and a manufacturing method of the suspension board assembly sheet with circuits.

(1) According to one aspect of the present invention, a suspension board assembly sheet with circuits includes a plurality of suspension boards with circuits, a support frame that integrally supports the plurality of suspension boards with circuits, and a plurality of inspection substrates provided to correspond to the plurality of suspension boards with circuits, wherein each of the plurality of suspension boards with circuits includes a conductive first support substrate, a first insulating layer formed on the first support substrate, a conductor line formed on the first insulating layer, and a first via that passes through the first insulating layer and electrically connects the first support substrate and the conductor line, each of the plurality of inspection substrates includes a conductive second support substrate, a second insulating layer formed on the second support substrate, a conductor layer formed on the second insulating layer and a second via that passes through the second insulating layer and electrically connects the second support substrate and the conductor layer, and the first via and the second via have the same configuration.

In this suspension board assembly sheet with circuits, the plurality of suspension boards with circuits are integrally supported by the support frame. The plurality of inspection substrates are provided to correspond to the plurality of suspension boards with circuits. In each of the plurality of suspension boards with circuits, the first insulating layer is formed on the conductive first support substrate. A conductor line is formed on the first insulating layer. The first support substrate and the conductor line are electrically connected by the first via that passes through the first insulating layer. In each of the plurality of inspection substrates, the second insulating layer is formed on the conductive second support substrate. A conductor layer is formed on the second insulating layer. The second support substrate and the conductor layer are electrically connected by the second via that passes through the second insulating layer.

In this case, the plurality of inspection substrates are formed to correspond to the plurality of suspension boards with circuits, and the first vias of the plurality of suspension boards with circuits and the second via of the inspection substrate have the same configuration. Thus, the state of the first via and the state of the second via have a high correlation. Therefore, it is possible to perform the inspection of the first vias of the plurality of suspension boards in a short period of time and to improve the reliability of the inspection result by performing the inspection of the second via of the inspection substrate.

(2) The plurality of inspection substrates may be arranged in the support frame. In this case, it is not necessary to separately provide a space for arranging the plurality of inspection substrates. Further, it is not necessary to provide another member for supporting the plurality of inspection substrates at the support frame. Thus, the configuration of the suspension board assembly sheet with circuits can be simplified, and the size of the suspension board assembly sheet with circuits can be decreased.

(3) The support frame may surround at least part of the plurality of suspension boards with circuits, and the plurality of inspection substrates may be arranged in a region surrounded by the support frame.

In this case, each of the plurality of inspection substrates is arranged at a position close to each of the plurality of suspension boards with circuits. Thus, a correlation between the state of the first via and the state of the second via can be increased.

(4) Distances between the plurality of inspection substrates and the plurality of suspension substrates that correspond to the plurality of inspection substrates, respectively, may be equal to each other.

In this case, in the plurality of suspension boards with circuits and the plurality of inspection substrates, an equal correlation is established between the state of the first via and the state of the second via. Therefore, it is possible to more sufficiently improve the reliability of the inspection results by comparing the inspection results of the plurality of inspection substrates.

(5) A shortest distance between each of the plurality of inspection substrates and the suspension board with a circuit that corresponds to each of the plurality of inspection substrates may be not less than 0 μm and not more than 12000 μm.

In this case, a correlation between the state of the first via and the state of the second via can be more sufficiently increased.

(6) The plurality of suspension boards with circuits and the plurality of inspection substrates may be provided such that the one or plurality of inspection substrates correspond to each of the plurality of the suspension boards with circuits.

In this case, the state of the first via for each suspension board with a circuit can be inspected. Thus, the reliability of the inspection result for each suspension board with a circuit can be improved.

(7) The second insulating layer may have an opening that is formed such that part of the second support substrate is exposed.

In this case, when electrical characteristics of the second via is inspected, a probe of an inspection device can be easily brought into contact with the second support substrate exposed in the opening. Thus, the electric characteristics of the second via can be efficiently and easily inspected.

(8) The opening may be formed such that a portion having a length of not more than 300 μm of the second support substrate is exposed.

In this case, when the electric characteristics of the second via is inspected, the probe of the inspection device can be more easily brought into contact with the second support substrate exposed in the opening. Thus, the electric characteristics of the second via can be more efficiently and easily inspected.

(9) The plurality of suspension boards with circuits may further include a third insulating layer formed on the first insulating layer such that at least part the conductor line and the first via are covered, and the inspection substrate may further include a fourth insulating layer formed on the second insulating layer such that the second via is covered and at least part of the conductor layer is exposed.

In this case, when the electric characteristics of the second via are inspected, the probe of the inspection device can be easily brought into contact with the exposed conductor layer. Thus, the electric characteristics of the second via can be efficiently and easily inspected. Further, corrosion of the first via is prevented by the third insulating layer, and corrosion of the second via is prevented by the fourth insulating layer. Thus, a decrease in the correlation over time between the state of the second via of the inspection substrate and the state of the first via of each of the plurality of suspension boards with circuits can be prevented.

(10) The fourth insulating layer may be formed such that a portion having a length of not less than 300 μm of the conductor layer is exposed.

In this case, when the electric characteristics of the second via are inspected, the probe of the inspection device can be more easily brought into contact with the exposed conductor layer. Thus, the electric characteristics of the second via can be more efficiently and more easily inspected.

(11) The plurality of suspension boards with circuits may be supported by the support frame while being arranged in alignment.

In this case, it is possible to provide the larger number of the suspension boards with circuits and inspection substrates at the suspension board assembly sheet with circuits without an increase in the size of the support frame. Thus, a manufacturing cost of the suspension board assembly sheet with circuits can be decreased.

(12) According to another aspect of the present invention, a manufacturing method of a suspension board assembly sheet with circuits includes the steps of preparing a base material having a laminate structure of a conductive support substrate and an insulating layer, forming a plurality of first insulating layers for a plurality of suspension boards with circuits and a second insulating layer for a plurality of inspection substrates by processing the insulating layer, respectively forming first vias electrically connected to the support substrate at the plurality of first insulating layers and forming second vias electrically connected to the support substrate at the second insulating layer, and respectively forming conductor lines on the plurality of first insulating layers to be electrically connected to the first vias and forming conductor layers on the second insulating layer to be electrically connected to the second vias, and fabricating the plurality of suspension boards with circuits, the plurality of inspection substrates and the support frame by removing regions of the support substrate except for regions for the plurality of suspension boards with circuits, regions for the plurality of inspection substrates and a region for the support frame, in the support substrate, wherein the plurality of inspection substrates are provided to correspond to the plurality of suspension boards with circuits.

According to this manufacturing method of the suspension board assembly sheet with circuits, the plurality of suspension boards with circuits are integrally supported by the support frame. The plurality of inspection substrates are provided to correspond to the plurality of suspension boards with circuits. In each of the plurality of suspension boards with circuits, the first insulating layer is formed on the conductive first support substrate. The conductor line is formed on the first insulating layer. The first support substrate and the conductor line are electrically connected by the first via that passes through the first insulating layer. In each of the plurality of inspection substrates, the second insulating layer is formed on the conductive second support substrate. The conductor layer is formed on the second insulating layer. The second support substrate and the conductor layer are electrically connected by the second via that passes through the second insulating layer.

In this case, each of the plurality of inspection substrates is formed to correspond to each of the plurality of suspension boards with circuits, and the first via of each of the plurality of suspension boards with circuits and the second via of the inspection substrate have the same configuration. Thus, the state of the first via and the state of the second via have a high correlation. Therefore, it is possible to perform the inspection of the first via of each of the plurality of suspension boards in a short period of time and to improve the reliability of the inspection results by performing the inspection of the second via of the inspection substrate.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 18 is a diagram showing a relation between a resistance value of a via of the inspection substrate and a resistance value of a via of the suspension board.

DESCRIPTION OF THE PREFERRED EMBODIMENTS

A suspension board assembly sheet with circuits and a manufacturing method of the suspension board assembly sheet with circuits according to one embodiment of the present invention will be described below with reference to drawings. The suspension board assembly sheet with circuits (hereinafter abbreviated as an assembly sheet) is a semi-finished product in the manufacturing process of the suspension board with a circuit (hereinafter abbreviated as a suspension board). First, the configuration of the assembly sheet will be described.

(1) Assembly Sheet

Figure 1:
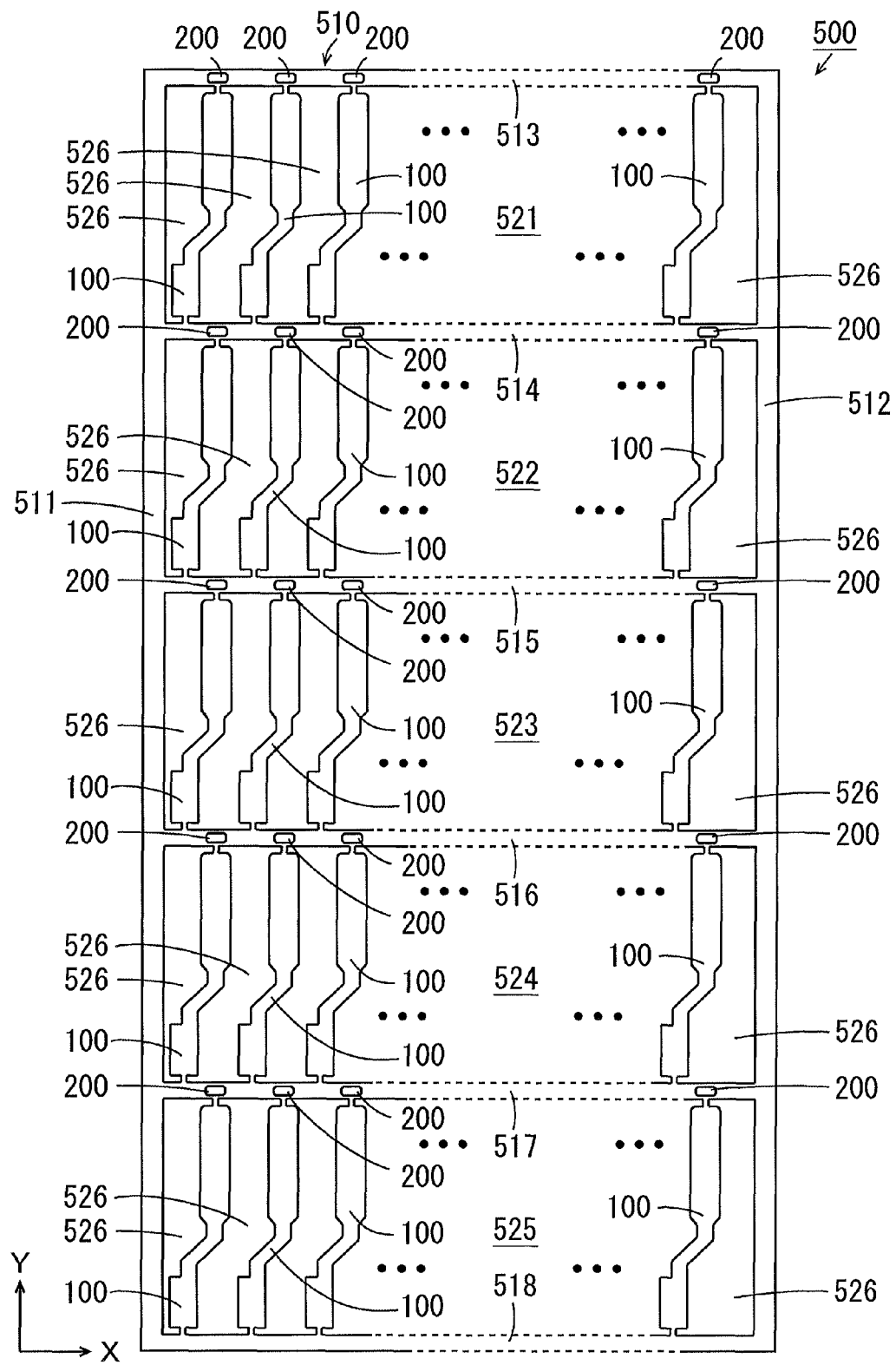
FIG. 1 is a top view of an assembly sheet according to one embodiment of the present invention.
Figure 2:
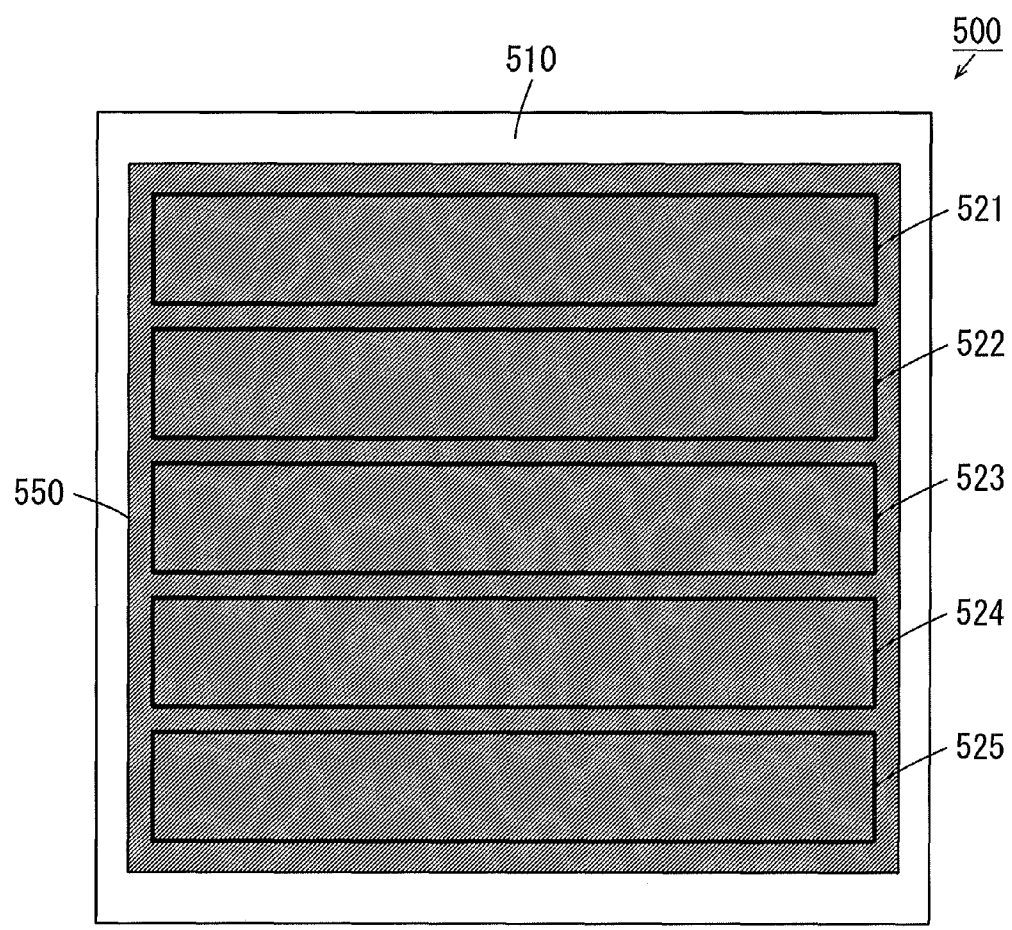
FIG. 2 is a top view of the assembly sheet according to the one embodiment of the present invention.
Figure 3:
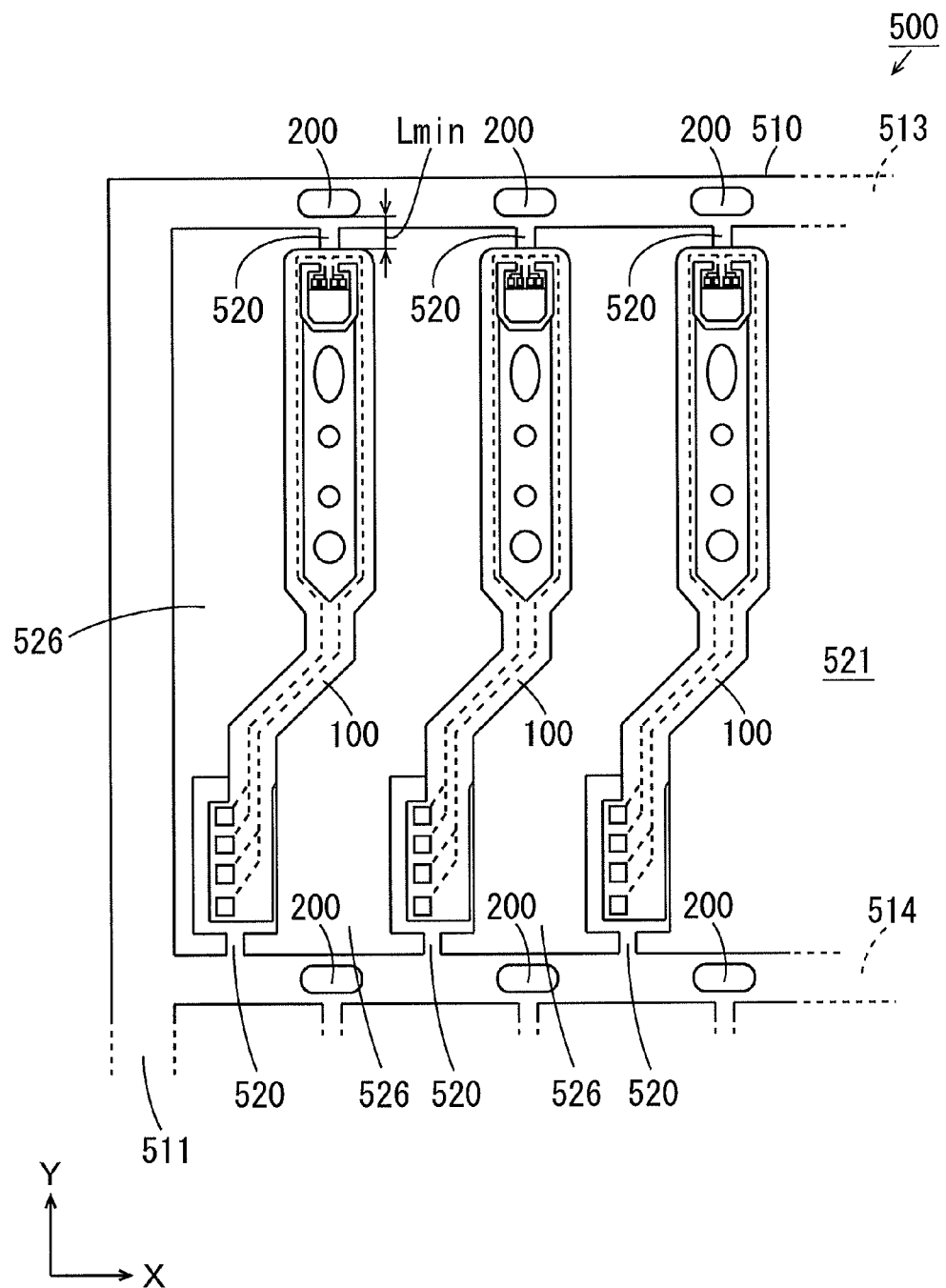
FIG. 3 is a partially enlarged top view of the assembly sheet of FIG. 1.

FIGS. 1 and 2 are top views of the assembly sheet according to the one embodiment of the present invention. Further, FIG. 3 is a partially enlarged top view of the assembly sheet 500 of FIG. 1. The assembly sheet 500 is fabricated of a long-sized metallic support substrate. In FIGS. 1 and 3, two directions that are orthogonal to each other are defined as the X direction and the Y direction as shown by the arrows X, Y. In the present example, the X direction and the Y direction are parallel to a horizontal plane. At the time of manufacturing, the plurality of assembly sheets 500 are fabricated to be arranged in a longitudinal direction at the long-sized support substrate. In FIG. 1, the one assembly sheet 500 on the support substrate is shown.

As shown in FIG. 1, the assembly sheet 500 has a rectangular outer shape, and includes a support frame 510, a plurality of long-sized suspension boards 100 and a plurality of inspection substrates 200 (substrates 200 for inspection). As shown in FIG. 2, a region (hereinafter referred to as a product guarantee region) 550 is set inside of the support frame 510 in the assembly sheet 500. In FIG. 2, the product guarantee region 550 is shown by a hatching pattern. The product guarantee region 550 is a region in which each suspension board 100 is to be protected to satisfy a predetermined specification. The support frame 510 is made of a pair of side frames 511, 512 and a plurality of end frames 513, 514, 515, 516, 517, 518.

The pair of side frames 511, 512 is opposite to each other with the plurality of suspension boards sandwiched therebetween and extends in the Y direction. The end frames 513 to 518 extend in the X direction that is orthogonal to the pair of side frames 511, 512, and are formed to connect the pair of side frames 511, 512, respectively. The end frames 513 to 518 are arranged at equal intervals in the Y direction from the one end to the other end of the pair of side frames 511, 512. Thus, a plurality of (five in the present example) rectangular regions 521, 522, 523, 524, 525 that are partitioned by the side frames 511, 512 and the end frames 513 to 518 are formed inside of the product guarantee region 550. In FIG. 2, the rectangular regions 521 to 525 inside of the product guarantee region 550 are surrounded by the bold solid line.

The plurality of suspension boards 100 are provided to extend in the Y direction and to be arranged in the X direction in the rectangular regions 521 to 525. Separation grooves 526 are formed along the outer peripheral edge of each suspension board 100.

As shown in FIG. 3, both ends of each suspension board 100 in the Y direction are coupled to the support frame 510 with a coupling portion 520 sandwiched therebetween. In the present embodiment, the plurality of inspection substrates 200 are formed in the end frames 513 to 517 at one end of each of the plurality of suspension boards 100 to correspond to the plurality of suspension boards 100, respectively. In the example of FIG. 3, the plurality of inspection substrates 200 that correspond to the plurality of suspension boards 100 in the rectangular region 521, respectively, are formed in the end frame 513.

Similarly, the plurality of inspection substrates 200 that correspond to the plurality of suspension boards 100 in the rectangular region 522, respectively, are formed in the end frame 514. The plurality of inspection substrates 200 that correspond to the plurality of suspension boards 100 in the rectangular region 523, respectively, are formed in the end frame 515. The plurality of inspection substrates 200 that correspond to the plurality of suspension boards 100 in the rectangular region 524, respectively, are formed in the end frame 516. The plurality of inspection substrates 200 that correspond to the plurality of suspension boards 100 in the rectangular region 525, respectively, are formed in the end frame 517. In the present embodiment, a one-to-one correspondence is established between each of the plurality of suspension boards 100 and each of the plurality of inspection substrates 200.

Distances between the plurality of inspection substrates 200 and the plurality of suspension boards 100 that correspond to the plurality of inspection substrates 200, respectively, are equal to each other. In the example of FIG. 3, the shortest distance between each suspension board 100 and the inspection substrate 200 that corresponds to the suspension board 100 is shown as Lmin. The shortest distance Lmin is preferably not less than 0 μm and not more than 12000 μm, and is more preferably not less than 500 μm and not more than 6000 μm. It is also similar for the below-mentioned FIGS. 12 to 16. In this case, a correlation between a state of each of vias 128, 129 of the below-mentioned suspension board 100 and a state of a via 221 of the inspection substrate 200 can be more sufficiently increased.

In this manner, in each rectangular region 521 to 525, the plurality of suspension boards 100 are supported by the support frame 510 while being arranged in alignment. Further, the plurality of inspection substrates 200 are formed in the end frames 513 to 517. Therefore, it is possible to form the larger number of suspension boards 100 and inspection substrates 200 at the assembly sheet 500 without an increase in the size of the support frame 510. Thus, a manufacturing cost of the assembly sheet 500 can be decreased. The coupling portions 520 are cut after the assembly sheet 500 is manufactured such that each suspension board 100 is separated from the support frame 510.

(2) Configuration of Suspension Board

Figure 4:
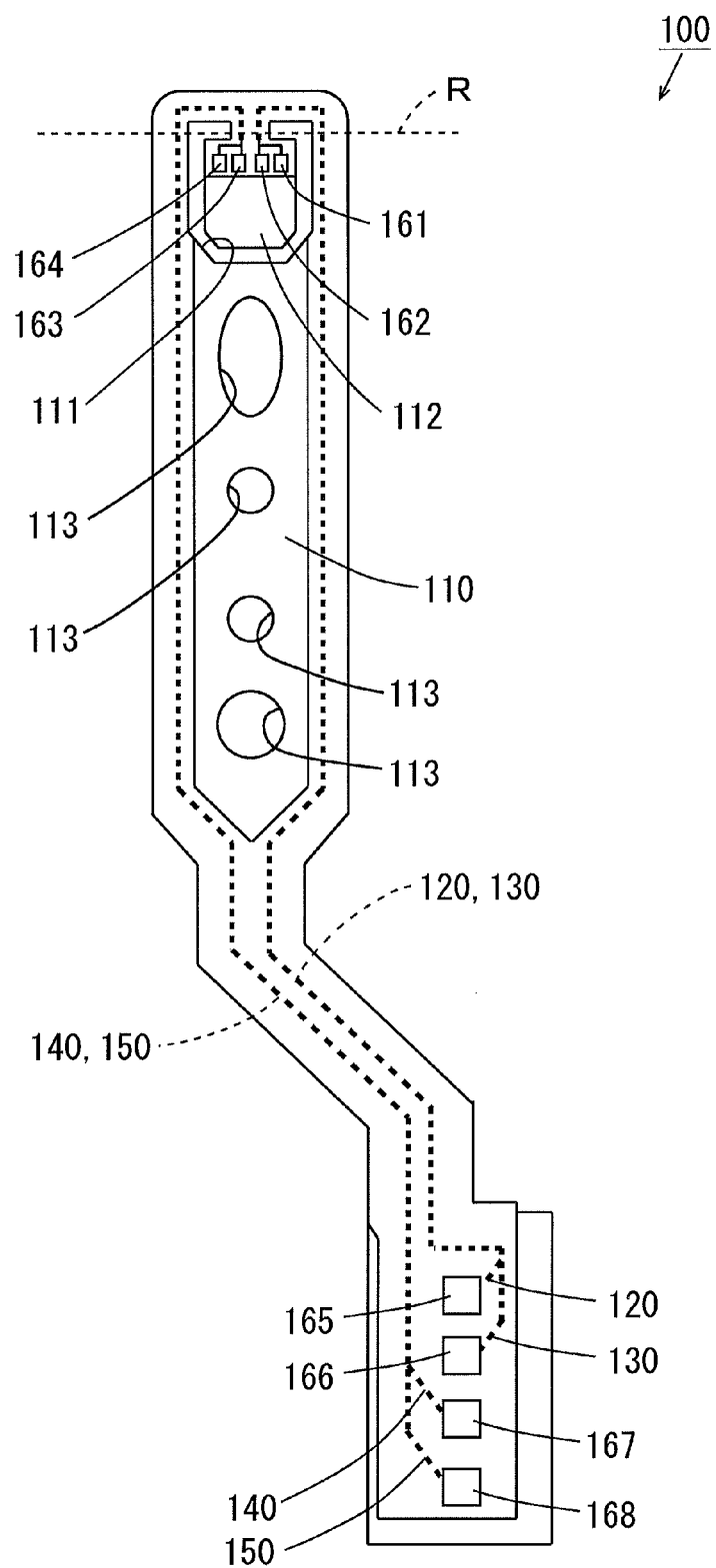
FIG. 4 is a top view of a suspension board of FIG. 1.

FIG. 4 is a top view of the suspension board 100 of FIG. 1. As shown in FIG. 4, the suspension board 100 includes a support substrate 110 formed of a metallic long-sized substrate. Write wiring traces 120, 130 and read wiring traces 140, 150 are formed on the support substrate 110 as indicated by the bold dotted line. In FIG. 4, the write wiring traces 120, 130 are indicated by the single dotted line, and the read wiring traces 140, 150 are indicated by the single dotted line. The write wiring trace 120 and the write wiring trace 130 constitute a signal line pair. Further, the read wiring trace 140 and the read wiring trace 150 constitute a signal line pair.

At the tip of the support substrate 110, a magnetic head supporting portion (hereinafter referred to as a tongue) 112 is provided by forming a U-shaped opening 111. The tongue 112 is bent along the broken line R to form a predetermined angle with respect to the support substrate 110. Four electrode pads 161, 162, 163, 164 are formed at the end of the tongue 112.

Four electrode pads 165, 166, 167, 168 are formed at the other end of the support substrate 110. The electrode pads 161 to 164 on the tongue 112 and the electrode pads 165 to 168 at the other end of the support substrate 110 are electrically connected by the write wiring traces 120, 130 and the read wiring traces 140, 150, respectively. Further, a plurality of holes 113 are formed at the support substrate 110.

In the hard disc drive device (not shown) including the suspension board 100, an electric current flows through the pair of write wiring traces 120, 130 at the time of writing information in a magnetic disc. Further, a current flows through the pair of read wiring traces 140, 150 at the time of reading the information from the magnetic disc.

(3) Write Wiring Traces

Figure 5:
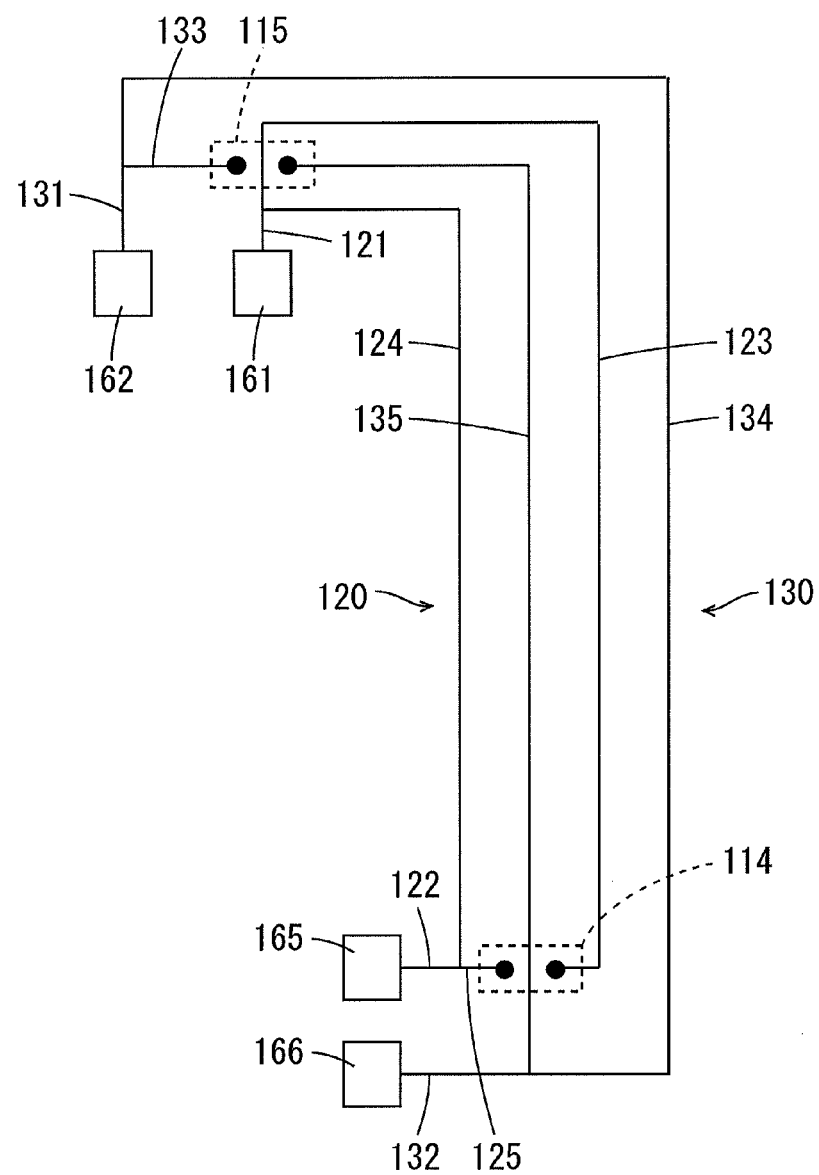
FIG. 5 is a schematic diagram showing the configuration of write wiring traces.

Next, detailed configuration of the write wiring traces 120, 130 will be described. FIG. 5 is a schematic diagram showing the configuration of the write wiring traces 120, 130. As shown in FIG. 5, the write wiring trace 120 is constituted by lines 121 to 125. The line 121 is connected to the electrode pad 161, and the line 122 is connected to the electrode pad 165.

One end of each of the lines 123, 124 is integrated into the line 121. The other end of the line 123 and the one end of the line 125 are electrically connected in an intersection region 114. The details of the intersection region 114 will be described below. The other end of each of the lines 124, 125 is integrated into the line 122.

The write wiring trace 130 is constituted by lines 131 to 135. The line 131 is connected to the electrode pad 162, and the line 132 is connected to the electrode pad 166. One end of each of the lines 133, 134 is integrated into the line 131. The other end of the line 133 and one end of the line 135 are electrically connected in an intersection region 115. The details of the intersection region 115 will be described below. The other end of each of the lines 134, 135 is integrated into the line 132.

The lines 123, 124 of the write wiring trace 120 and the lines 134, 135 of the write wiring trace 130 are arranged to alternate and to be parallel to each other. The line 123 of the write wiring trace 120 extends in-between the ends of the lines 133, 135 of the write wiring trace 130 in the intersection region 115, and the line 135 of the write wiring trace 130 extends in-between the ends of the lines 123, 125 of the write wiring trace 120 in the intersection region 114.

Figure 6:
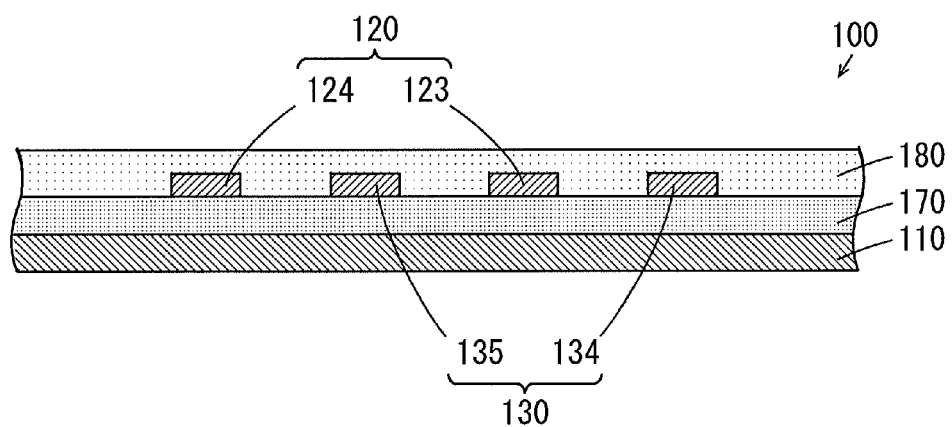
FIG. 6 is a schematic cross sectional view of lines of the write wiring traces and their periphery.

FIG. 6 is a schematic cross sectional view of the lines 123, 124, 134, 135 of the write wiring traces 120, 130 and their peripheral portions. As shown in FIG. 6, a base insulating layer 170 is formed on the support substrate 110. The lines 123, 124, 134, 135 of the write wiring traces 120, 130 are formed on the base insulating layer 170. A cover insulating layer 180 is formed on the base insulating layer 170 to cover the write wiring traces 120, 130.

Figure 7A:
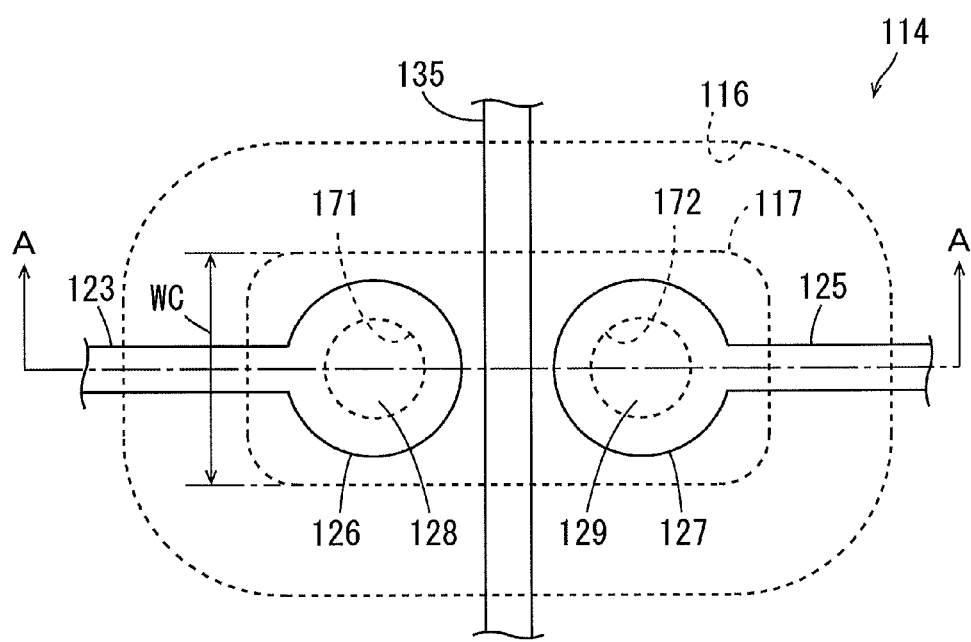
FIGS. 7A and 7B are diagrams showing an intersection region of FIG. 5 and its periphery.
Figure 7B:
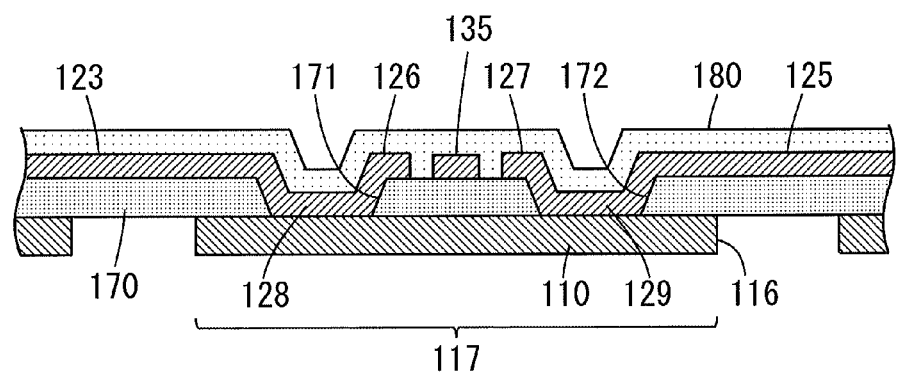

FIGS. 7A and 7B are diagrams showing the intersection region 114 of FIG. 5 and its periphery. FIG. 7A shows a detailed plan view of the intersection region 114, and FIG. 7B shows a cross sectional view taken along the line A-A of FIG. 7A. The intersection region 115 has the configuration similar to the intersection region 114.

As shown in FIGS. 7A and 7B, an annular opening 116 is formed at the support substrate 110. Thus, an island-shape region 117 that is electrically separated from other regions of the support substrate 110 is formed. The line 135 of the write wiring trace 130 is arranged to extend and pass through a portion over the region 117 of the support substrate 110, and the end of the line 123 and the end of the line 125 of the write wiring trace 120 are arranged on both sides of the line 135.

Circular connection portions 126, 127 are provided at the end of the line 123 and the end of the line 125, respectively. Further, through holes 171, 172 are formed in portions of the base insulating layer 170 below the connection portions 126, 127, respectively. Each of the through holes 171, 172 is formed in a tapered shape such that the diameter thereof is gradually decreased as approaching the lower surface from the upper surface of the base insulating layer 170.

The connection portion 126 comes into contact with the region 117 of the support substrate 110 in the through hole 171, and the connection portion 127 comes into contact with the region 117 of the support substrate 110 in the through hole 172. A via 128 is formed of a portion of the connection portion 126 in the through hole 171, and a via 129 is formed of a portion of the connection portion 127 in the through hole 172. This causes the lines 123, 125 to be electrically connected through the vias 128, 129 and the region 117 of the support substrate 110.

The diameter of the connection portion 126 is preferably larger than the width of the line 123, and the diameter of the connection portion 127 is preferably larger than the width of the line 125. Further, the diameter of the through hole 171 of the base insulating layer 170 is preferably larger than the width of the line 123, and the diameter of the through hole 172 is preferably larger than the width of the line 125. Thus, the electrical connection between the lines 123, 125 is sufficiently ensured.

Note that a width WC of the region 117 of the support substrate 110 is preferably constant in its portion between a contact portion of the region 117 with the connection portion 126 and a contact portion of the region 117 with the connection portion 127. In this case, a transmission loss in the region 117 of the support substrate 110 is decreased.

Further, the shape of each of the connection portions 126, 127 is not limited to circular. For example, another shape such as an elliptical shape, a triangular shape, a quadrangular shape or a shape of a sector may be employed. Further, a transverse cross sectional shape of each of the through holes 171, 172 is not limited to circular. For example, another shape such as an elliptical shape, a triangular shape, a quadrangular shape or a shape of a sector may be employed.

(4) Configuration of Inspection Substrate

Figure 8A:
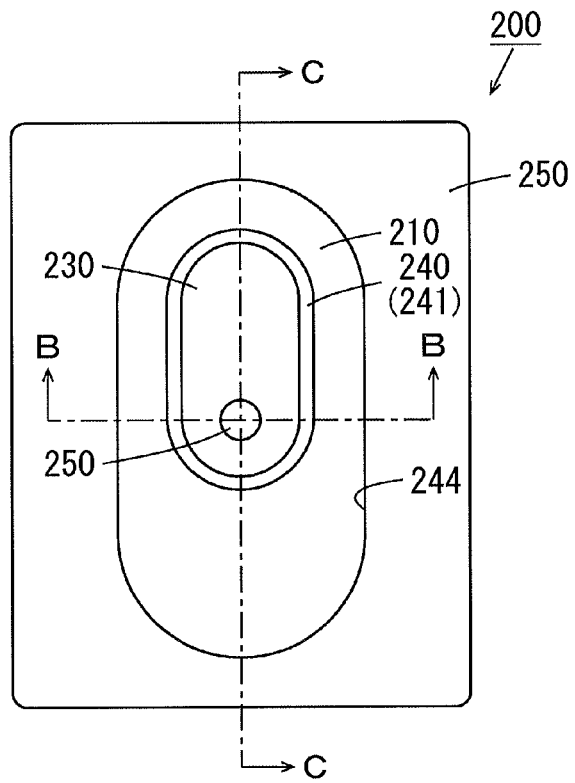
FIGS. 8A to 8C are diagrams showing the configuration of an inspection substrate.
Figure 8B:
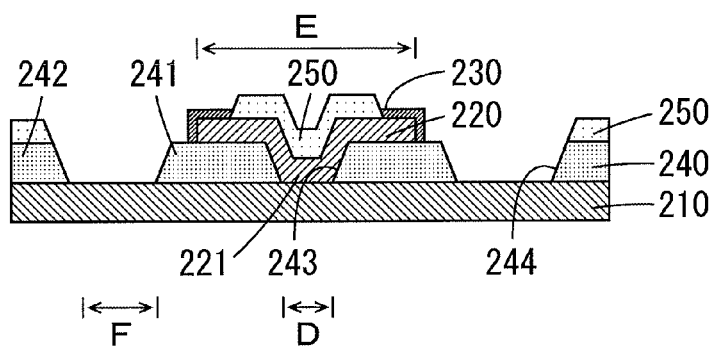
Figure 8C:
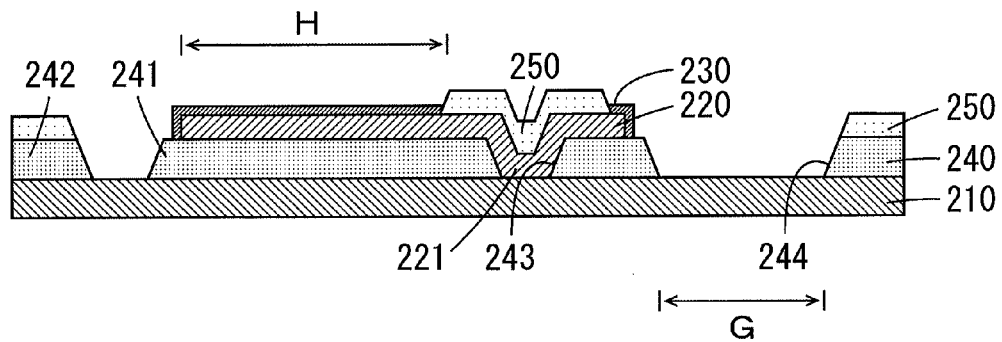

FIGS. 8A to 8C are diagrams showing the configuration of the inspection substrate 200. FIG. 8A shows a top view of the inspection substrate 200. FIG. 8B shows a cross sectional view taken along the line B-B of FIG. 8A. FIG. 8C shows a cross sectional view taken along the line C-C of FIG. 8A.

As shown in FIGS. 8A to 8C, the inspection substrate 200 includes a support substrate 210 formed of a metallic long-sized substrate. A base insulating layer 240 is formed on the support substrate 210. An annular opening 244 is formed at the base insulating layer 240. Thus, the base insulating layer 240 is separated into an island-shape inner region 241 and an outer region 242 surrounding the inner region 241. The support substrate 210 is exposed from the opening 244 between the inner region 241 and the outer region 242.

A through hole 243 is formed at the inner region 241 of the base insulating layer 240. The through hole 243 is formed in a tapered shape such that the diameter thereof is gradually decreased as approaching the lower surface from the upper surface of the base insulating layer 240. A transverse cross sectional shape of the through hole 243 is not limited to circular. For example, another shape such as an elliptical shape, a triangular shape, a quadrangular shape or a shape of a sector may be employed.

A conductor layer 220 is formed on the inner region 241. Part of the conductor layer 220 comes into contact with the support substrate 210 in the through hole 243. The via 221 is formed of a portion of the conductor layer 220 in the through hole 243. Thus, the conductor layer 220 and the support substrate 210 are electrically connected through the via 221. The vias 128, 129 of the support substrate 110 of FIGS. 7A and 7B and the via 221 of the support substrate 210 have the same configuration.

In the present example, the inspection substrates 200 are formed inside of the product guarantee region 550 of the assembly sheet 500 of FIG. 2. At least, the vias 221 of the inspection substrates 200 are formed inside of the product guarantee region 550 of the assembly sheet 500.

A plating layer 230 is formed on the surface of the conductor layer 220 except for a portion of the via 221 of the conductor layer 220. A cover insulating layer 250 is formed to cover the outer region 242 of the base insulating layer 240 and the via 221 of the conductor layer 220.

The opening 244 is preferably formed such that a portion having a length of not less than 100 μm and not more than 1500 μm of a G portion of FIG. 8C of the support substrate 210 is exposed. In this case, at the time of inspecting the electric characteristics of the via 221, a probe of an inspection device can be more easily brought into contact with the support substrate 210 exposed in the opening 244. Thus, the electric characteristics of the via 221 can be more efficiently and easily inspected.

Further, the cover insulating layer 250 is preferably formed such that a portion having the length of not less than 100 μm and not more than 1500 μm of a H portion of FIG. 8B of the conductor layer 220 is exposed from the cover insulating layer 250. In this case, at the time of inspecting the electric characteristics of the via 221, the other probe of the inspection device can be more easily brought into contact with the exposed conductor layer 220. Thus, the electric characteristics of the via 221 can be more efficiently and easily inspected.

In the present example, a minimum diameter of the through hole 243 (a D portion of FIG. 8B) is set to not less than 10 μm and not more than 100 μm. The length of the shortest portion of the conductor layer 220 (an E portion of FIG. 8B) is set to not less than 100 μm and not more than 1500 μm. The width of the shortest portion of the opening 244 (an F portion of FIG. 8B) is set to not less than 30 μm and not more than 500 μm. The width of the longest portion of the opening 244 (the G portion of FIG. 8C) is set to not less than 100 μm and not more than 1500 μm. The length of the longest portion of the conductor layer 220 (the H portion of FIG. 8C) that is exposed from the cover insulating layer 250 is set to not less than 100 μm and not more than 1500 μm.

(5) Manufacturing Method of Assembly Sheet

Next, the manufacturing method of the assembly sheet 500 will be described. In the present example, the plurality of assembly sheets 500 are formed on the long-sized support substrate by a role-to-role system. FIGS. 9A to 11B are sectional views showing the steps of one example of a manufacturing method of the assembly sheet 500 according to the one embodiment of the present invention. The upper diagrams in FIGS. 9A to 11B correspond to the cross sectional view taken along the line A-A of FIG. 7A. The lower diagrams in FIGS. 9A to 11B correspond to the cross sectional view taking along the line B-B of FIG. 8A.

Figure 9A:
FIGS. 9A and 9B are cross sectional views showing steps of one example of a manufacturing method of an assembly sheet according to one embodiment of the present invention.
Figure 9A:
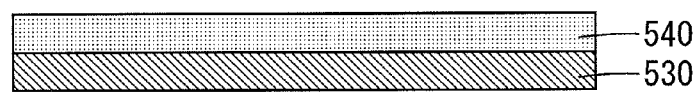

First, as shown in FIG. 9A, a base insulating layer 540 made of polyimide is formed on the long-sized support substrate 530 made of stainless steel. A two-layer base material having a laminate structure of the support substrate 530 and the base insulating layer 540 may be used.

Material for the support substrate 530 is not limited to stainless steel, and another metallic material such as aluminum (Al) may be used. The thickness of the support substrate 530 is not less than 10 μm and not more than 30 μm, for example, and is preferably not less than 12 μm and not more than 20 μm. Material for the base insulating layer 540 is not limited to polyimide, and another resin material such as epoxy may be used. The thickness of the base insulating layer 540 is not less than 3 μm and not more than 20 μm, for example, and is preferably not less than 5 μm and not more than 15 μm.

Figure 9B:
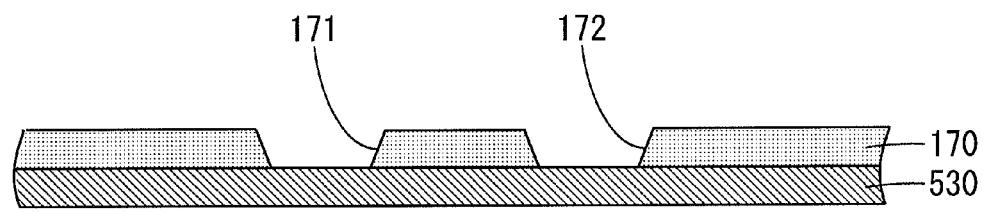
Figure 9B:
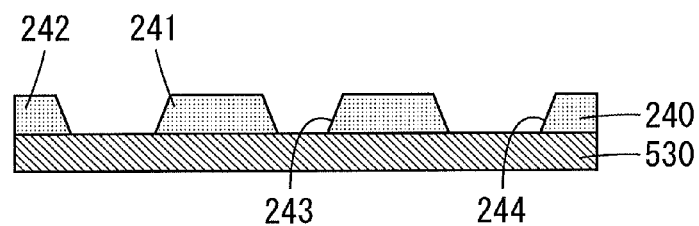

Then, as shown in FIG. 9B, the base insulating layer 540 is etched, for example, whereby the base insulating layer 170 for the suspension board 100 is formed and the base insulating layer 240 for the inspection substrate 200 is formed. Simultaneously, in the intersection regions 114, 115 of FIG. 5, the through holes 171, 172 are formed at portions of the base insulating layer 170. Further, the annular opening 244 is formed at the base insulating layer 240, whereby the inner region 241 and the outer region 242 are formed and the through hole 243 is formed in the inner region 241. The minimum diameter of each of the through holes 171, 172 is not less than 10 μm and not more than 200 μm, for example, and is preferably not less than 20 μm and not more than 100 μm.

Figure 10A:
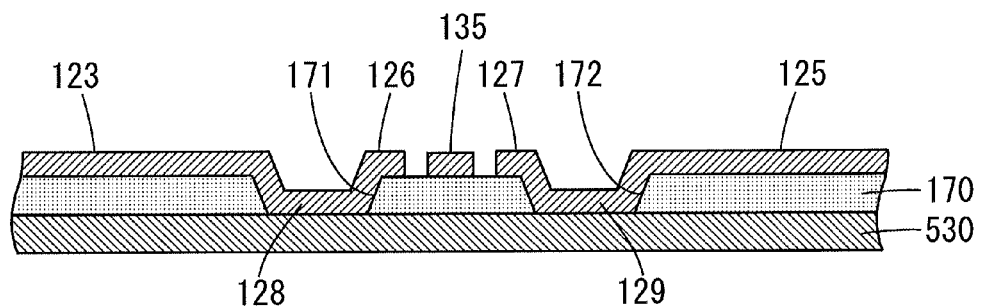
FIGS. 10A and 10B are cross sectional views showing steps of the one example of the manufacturing method of the assembly sheet according to the one embodiment of the present invention.
Figure 10A:
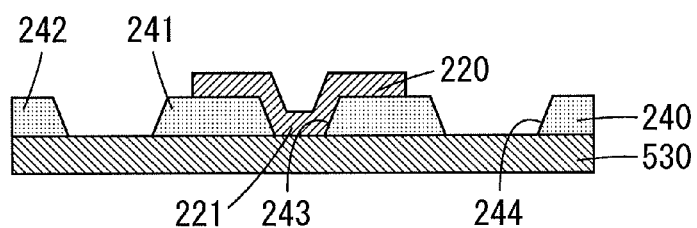

Subsequently, as shown in FIG. 10A, the write wiring traces 120, 130, the read wiring traces 140, 150 and the electrode pads 161 to 168 of FIG. 4 that are made of copper are formed on the base insulating layer 170 by electrolytic plating and the like, and the conductor layer 220 made of copper is formed on the base insulating layer 240. In FIG. 10A, only the portion of the lines 123, 125 and the connection portions 126, 127 of the write wiring trace 120, and the line 135 of the write wiring trace 130 are shown.

A portion of the connection portion 126 in the through hole 171 is the via 128, a portion of the connection portion 127 in the through hole 172 is the via 129 and a portion of the conductor layer 220 in the through hole 243 is the via 221. The write wiring traces 120, 130 and the read wiring traces 140, 150, and the conductor layer 220 may be formed using an additive method, a semi-additive method or another method such as a subtractive method.

Material for the write wiring traces 120, 130, the read wiring traces 140, 150, the electrode pads 161 to 168 and the conductor layer 220 is not limited to copper, and another metal such as gold (Au) or aluminum, or an alloy such as a copper alloy or an aluminum alloy may be used. The thickness of the write wiring traces 120, 130 and the read wiring traces 140, 150 is not less than 3 μm and not more than 16 μm, for example, and is preferably not less than 4 μm and not more than 13 μm. The width of the write wiring traces 120, 130 and the read wiring traces 140, 150 is not less than 6 μm and not more than 200 μm, for example, and is preferably not less than 8 μm and not more than 150 μm.

Figure 10B:
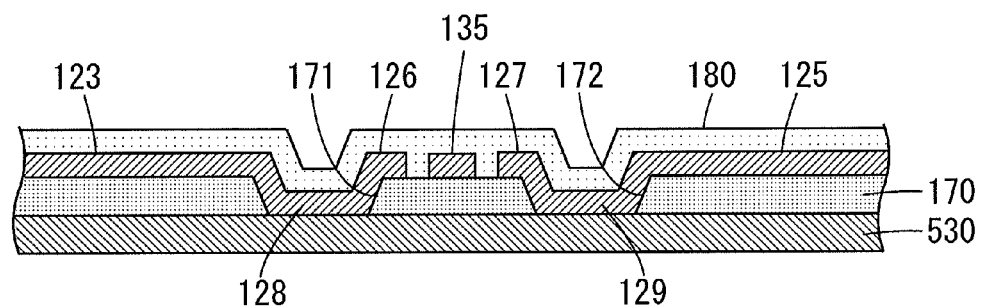
Figure 10B:
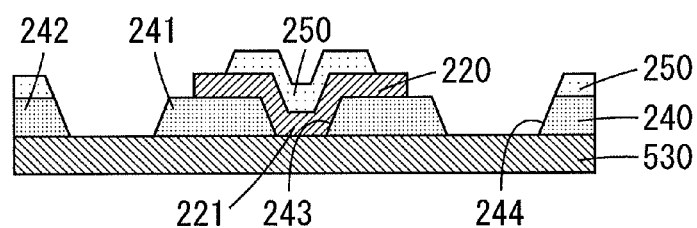

Thereafter, as shown in FIG. 10B, the cover insulating layer 180 made of polyimide is formed on the base insulating layer 170 to cover the write wiring traces 120, 130 and the read wiring traces 140, 150. Simultaneously, the cover insulating layer 250 made of polyimide is formed to cover the outer region 242 of the base insulating layer 240 and the via 221 of the conductor layer 220. Material for the cover insulating layers 180, 250 is not limited to polyimide, and another insulating material such as epoxy may be used. The thickness of each of the cover insulating layers 180, 250 is not less than 1 μm and not more than 30 μm, for example, and is preferably not less than 3 μm and not more than 10 μm.

Figure 11A:
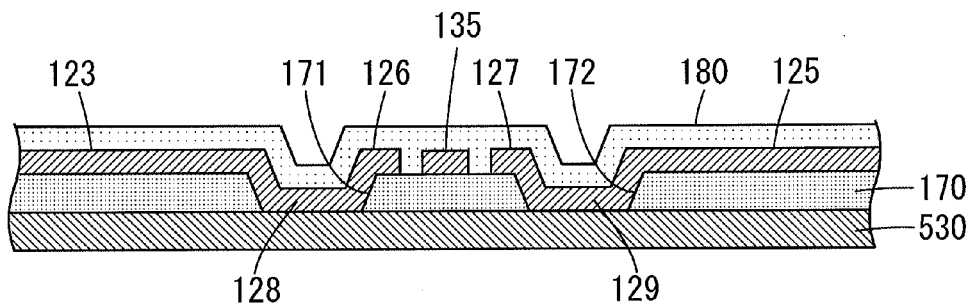
FIGS. 11A and 11B are cross sectional views showing steps of the one example of the manufacturing method of the assembly sheet according to the one embodiment of the present invention.
Figure 11A:
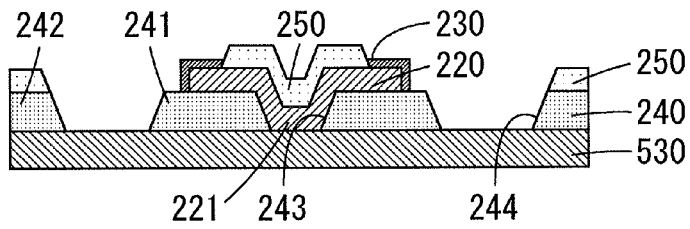

Next, as shown in FIG. 11A, the plating layer 230 made of gold (Au), for example, is formed on the surface of the conductor layer 220 except for the portion of the via 221 of the conductor layer 220. Simultaneously, a plating layer similar to the plating layer 230 is formed on the surface of each of the electrode pads 161 to 168 of FIG. 4.

Subsequently, the support substrate 530 is etched, for example, such that the separation grooves 526 of FIG. 1 are formed at the support substrate 530 and the annular opening 116 of FIG. 7B is formed in each of the intersection regions 114, 115 of FIG. 5. Simultaneously, the opening 111 and the plurality of holes 113 of FIG. 4 are formed at the support substrate 530. Further, the long-sized support substrate 530 is cut at constant intervals such that each of the assembly sheets 500 is separated.

Figure 11B:
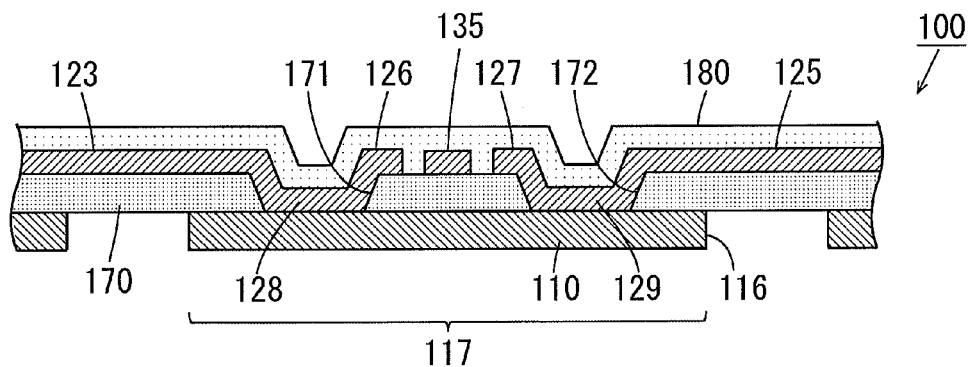
Figure 11B:
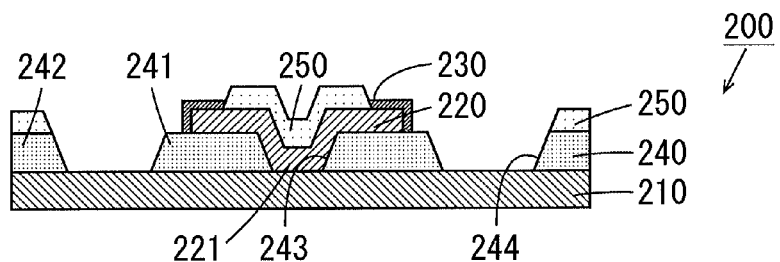

Thus, as shown in FIG. 11B, the support substrate 110 for the suspension board 100, the support substrate 210 for the inspection substrate 200, the support frame 510 and the coupling portion 520 of FIG. 3 are formed. Further, the annular opening 116 is formed at the support substrate 110, and the region 117 separated from other regions is formed at the support substrate 110. The area of the region 117 is not less than 1800 μm$^2$ and not more than 180000 μm$^2$, for example, and is preferably not less than 3200 μm$^2$ and not more than 80000 μm$^2$.

The assembly sheet 500 that includes the plurality of suspension boards 100, the plurality of inspection substrates 200 and the support frame 510 is completed by the above-mentioned steps.

(6) Inspection of Inspection Substrate

Inspection for the via 221 of the inspection substrate 200 formed at the assembly sheet 500 is performed. For example, one probe of the inspection device, is brought into contact with the plating layer 230 of the inspection substrate 200, and another probe is brought into contact with the support substrate 210 exposed in the opening 244 of the inspection substrate 200. Thus, a resistance value of the via 221 can be measured.

In this case, as described below, the resistance value of the via 221 of each of the plurality of inspection substrates 200 and a resistance value of each of the vias 128, 129 of the plurality of suspension boards 100 that correspond to the plurality of inspection substrates 200 have a high correlation. Therefore, it is possible to inspect whether the electric characteristics of each of the vias 128, 129 of the plurality of suspension boards 100 that corresponds to the plurality of inspection substrates 200 are proper or improper by measuring the resistance value of the via 221 of each of the plurality of inspection substrates 200. Therefore, the inspection of each of the vias 128, 129 of the plurality of suspension boards 100 can be performed in a short period of time, and the reliability of the inspection results can be improved.

After the inspection, the plurality of coupling portions 520 of the assembly sheet 500 are cut such that the plurality of suspension boards 100 can be separated from the support frame 510.

(7) Modified Examples (a) First Modified Example

While the plurality of inspection substrates 200 are formed in the end frames 513 to 517 at the one end of each of the plurality of suspension boards 100 in the above-mentioned embodiment, the invention is not limited to this. The plurality of inspection substrates 200 may be formed in any portion of the support frame 510.

Figure 12:
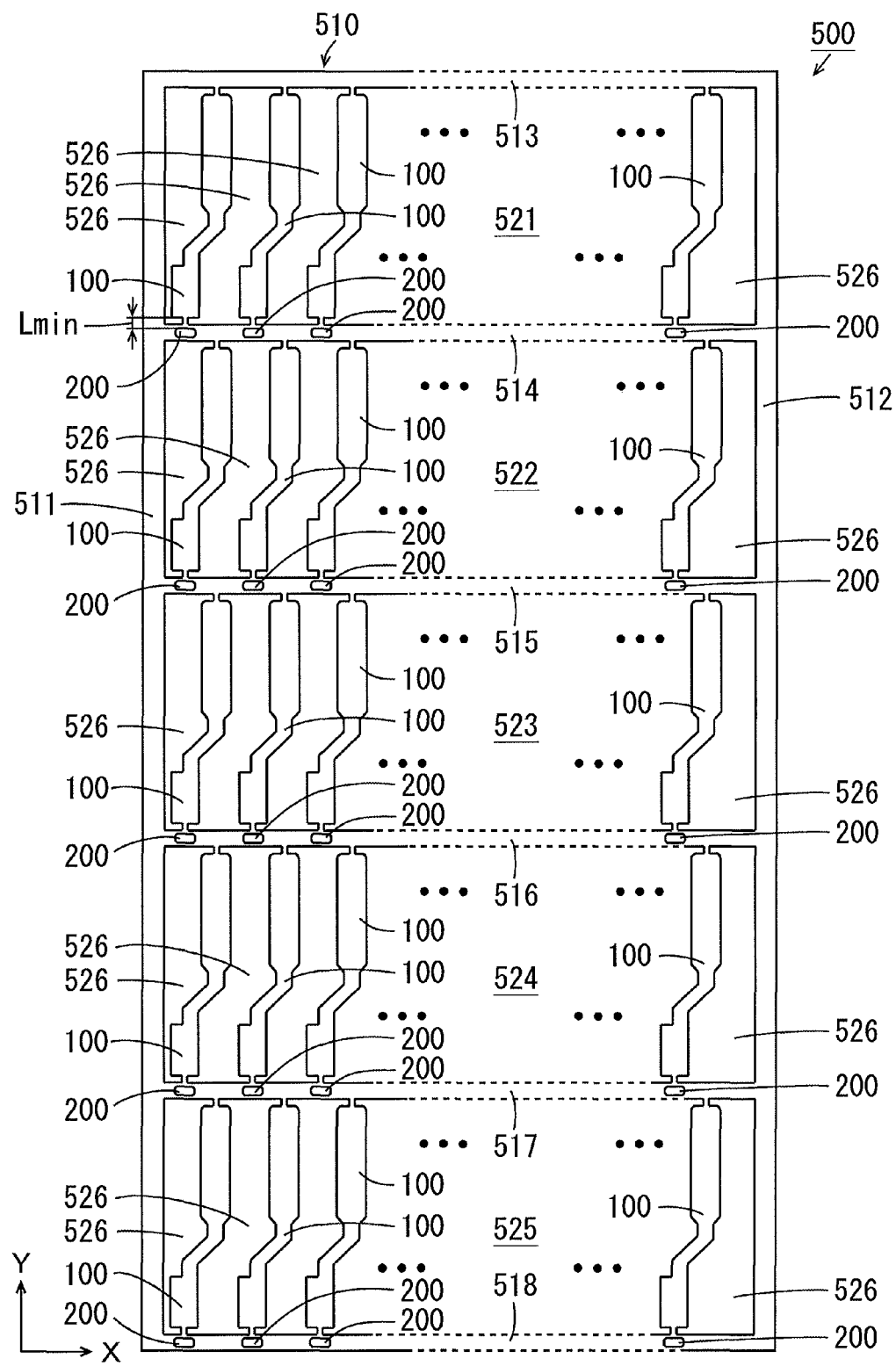
FIG. 12 is a top view of the assembly sheet according to a first modified example.

FIG. 12 is a top view of the assembly sheet 500 according to the first modified example. In the example of FIG. 12, the plurality of inspection substrates 200 are formed in the end frames 514 to 518 at the other end of each of the plurality of suspension boards 100 to correspond to the plurality of suspension boards 100, respectively. Specifically, the plurality of inspection substrates 200 that correspond to the plurality of suspension boards 100 in the rectangular regions 521 to 525, respectively, are formed in the end frames 514 to 518. In the present example, a one-to-one correspondence between each of the plurality of suspension boards 100 and each of the plurality of inspection substrates 200 is established.

(b) Second Modified Example

While the plurality of inspection substrates 200 are formed in the support frame 510 in the above-mentioned embodiment, the invention is not limited to this. The plurality of inspection substrates 200 may be formed in any portion in the product guarantee region 550 of the assembly sheet 500.

Figure 13:
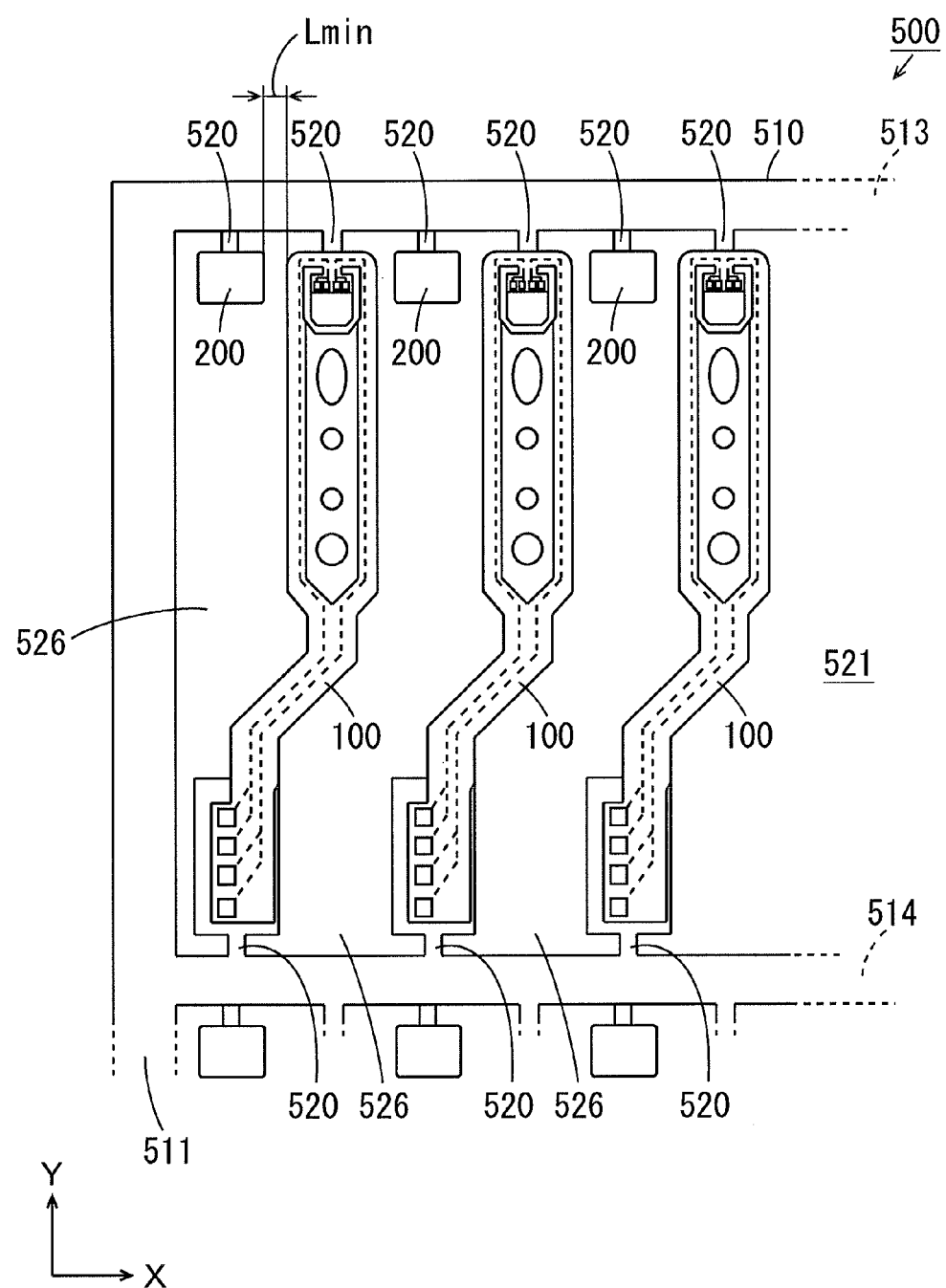
FIG. 13 is a partially enlarged top view of the assembly sheet according to a second modified example.

FIG. 13 is a partially enlarged top view of the assembly sheet 500 according to the second modified example. In the example of FIG. 13, the plurality of inspection substrates 200 that correspond to the plurality of suspension boards 100 in the rectangular region 521, respectively, are formed in the rectangular region 521. The plurality of inspection substrates 200 are connected to the end frame 513 with the plurality of coupling portions 520 sandwiched therebetween, respectively.

Similarly, the plurality of inspection substrates 200 that correspond to the plurality of suspension boards 100 in the rectangular region 522, respectively, are formed in the rectangular region 522. The plurality of inspection substrates 200 are connected to the end frame 514 with the plurality of coupling portions 520 sandwiched therebetween, respectively. The plurality of inspection substrates 200 that correspond to the plurality of suspension boards 100 in the rectangular region 523, respectively, are formed in the rectangular region 523. The plurality of inspection substrates 200 are connected to the end frame 515 with the plurality of coupling portions 520 sandwiched therebetween, respectively.

The plurality of inspection substrates 200 that correspond to the plurality of suspension boards 100 in the rectangular region 524, respectively, are formed in the rectangular region 524. The plurality of inspection substrates 200 are connected to the end frame 516 with the plurality of coupling portions 520 sandwiched therebetween, respectively. The plurality of inspection substrates 200 that correspond to the plurality of suspension boards 100 in the rectangular region 525, respectively, are formed in the rectangular region 525. The plurality of inspection substrates 200 are connected to the end frame 517 with the plurality of coupling portions 520 sandwiched therebetween, respectively.

In the present example, a one-to-one correspondence between each of the plurality of suspension boards 100 and each of the plurality of inspection substrates 200 is established. In the present example, each of the plurality of inspection substrates 200 is arranged at a position closer to each of the plurality of suspension boards 100, so that a correlation between the state of each of the vias 128, 129 and the state of the via 221 can be more sufficiently increased.

(c) Third Modified Example

Figure 14:
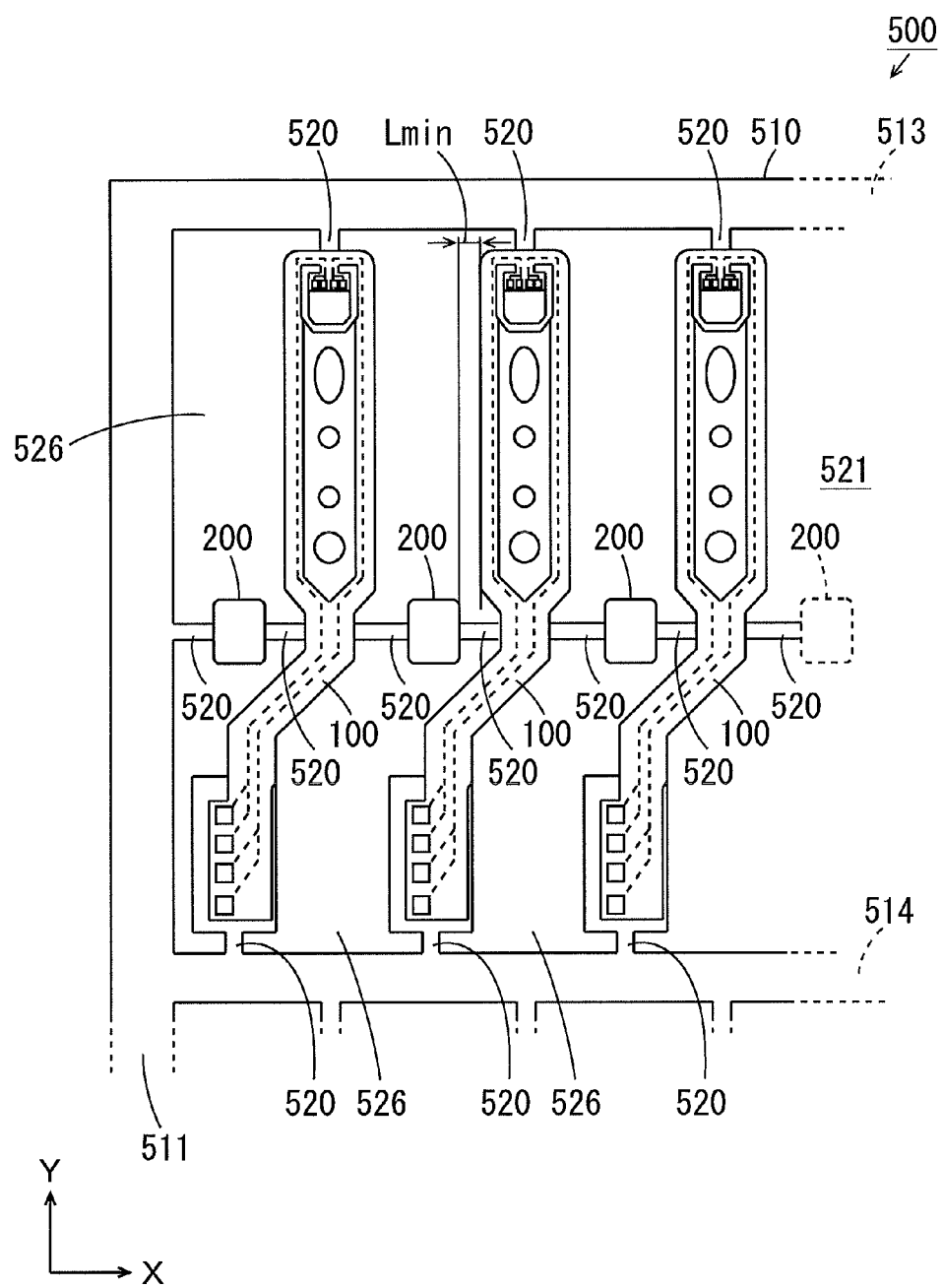
FIG. 14 is a partially enlarged top view of the assembly sheet according to a third modified example.

FIG. 14 is a partially enlarged top view of the assembly sheet 500 according to the third modified example. In the example of FIG. 14, the plurality of inspection substrates 200 that correspond to the plurality of the suspension boards 100, respectively, are arranged to be adjacent to the plurality of the suspension boards 100 in the X direction. Specifically, each inspection substrate 200 is arranged in the separation groove 526 between each two of the suspension boards 100, and each inspection substrate 200 is supported at the suspension boards 100 on both sides of the inspection substrate 200 by the coupling portions 520. Further, the one inspection substrate 200 is provided in the separation groove 526 between the suspension board 100 at the one end in the X direction and the side frame 511.

In the present example, a one-to-one correspondence between each of the plurality of suspension boards 100 and each of the plurality of inspection substrates 200 is established. Further, similarly to the second modified example, because each of the plurality of inspection substrates 200 is arranged at a position closer to each of the plurality of suspension boards 100, a correlation between the state of each of the vias 128, 129 and the state of the via 221 can be sufficiently increased.

(d) Fourth Modified Example

While the one inspection substrate 200 is provided for each suspension board 100 in the above-mentioned embodiment, the invention is not limited to this. Two or more than two inspection substrates 200 may be provided to correspond to each suspension board 100.

Figure 15:
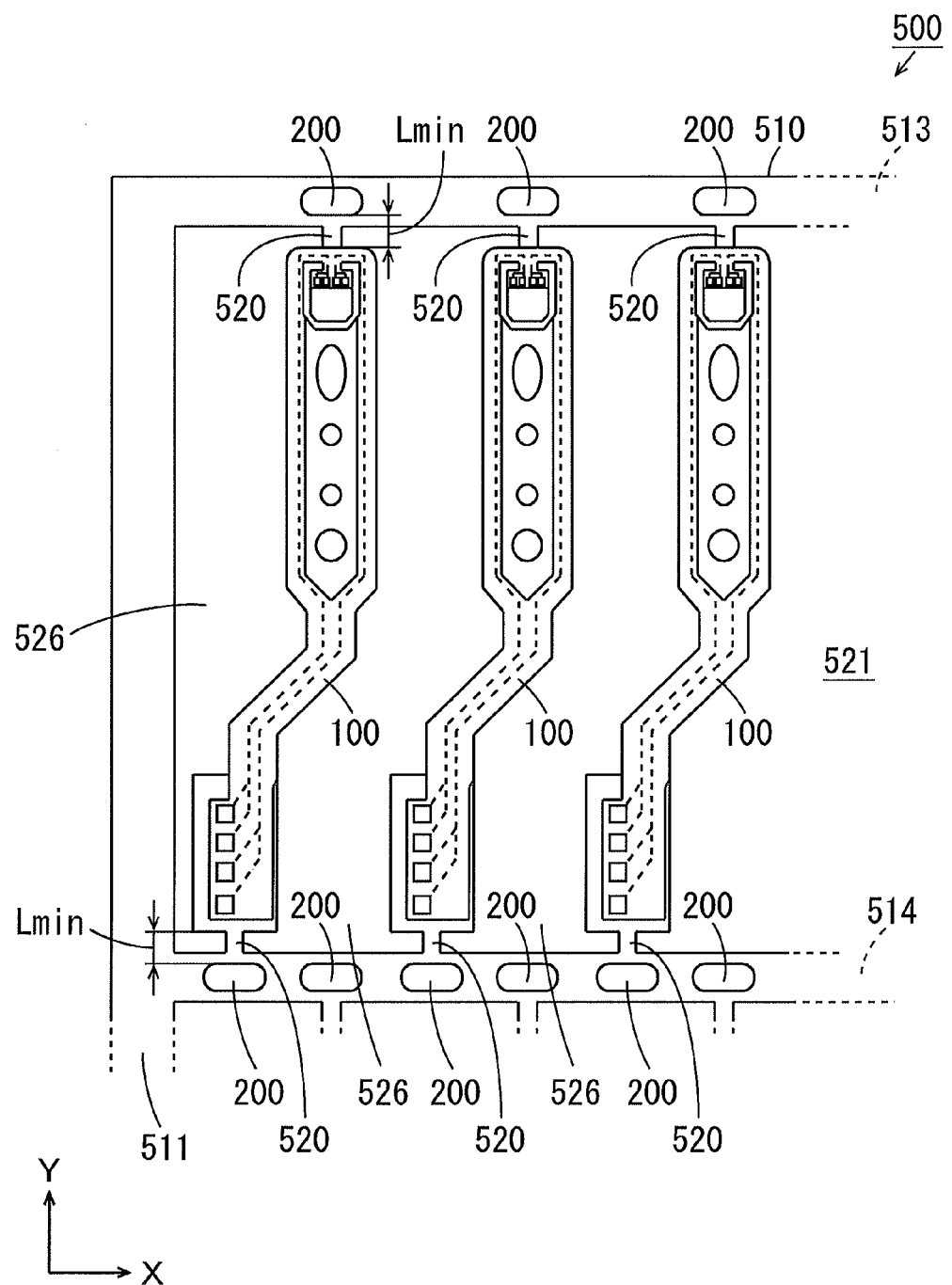
FIG. 15 is a partially enlarged top view of the assembly sheet according to a fourth modified example.

FIG. 15 is a partially enlarged top view of the assembly sheet 500 according to the fourth modified example. In the example of FIG. 15, each one suspension board 100 corresponds to the two inspection substrates 200. Specifically, the inspection substrate 200 that corresponds to the one end of each suspension board 100 in the rectangular region 521 is formed in the end frame 513, and the inspection substrate 200 that corresponds to the other end is formed in the end frame 514.

Similarly, the inspection substrate 200 that corresponds to the one end of each suspension board 100 in the rectangular region 522 is formed in the end frame 514, and the inspection substrate 200 that corresponds to the other end is formed in the end frame 515. The inspection substrate 200 that corresponds to the one end of each suspension board 100 in the rectangular region 523 is formed in the end frame 515, and the inspection substrate 200 that corresponds to the other end is formed in the end frame 516.

The inspection substrate 200 that corresponds to the one end of each suspension board 100 in the rectangular region 524 is formed in the end frame 516, and the inspection substrate 200 that corresponds to the other end is formed in the end frame 517. The inspection substrate 200 that corresponds to the one end of each suspension board 100 in the rectangular region 525 is formed in the end frame 517, and the inspection substrate 200 that corresponds to the other end is formed in the end frame 518.

(e) Fifth Modified Example

Figure 16:
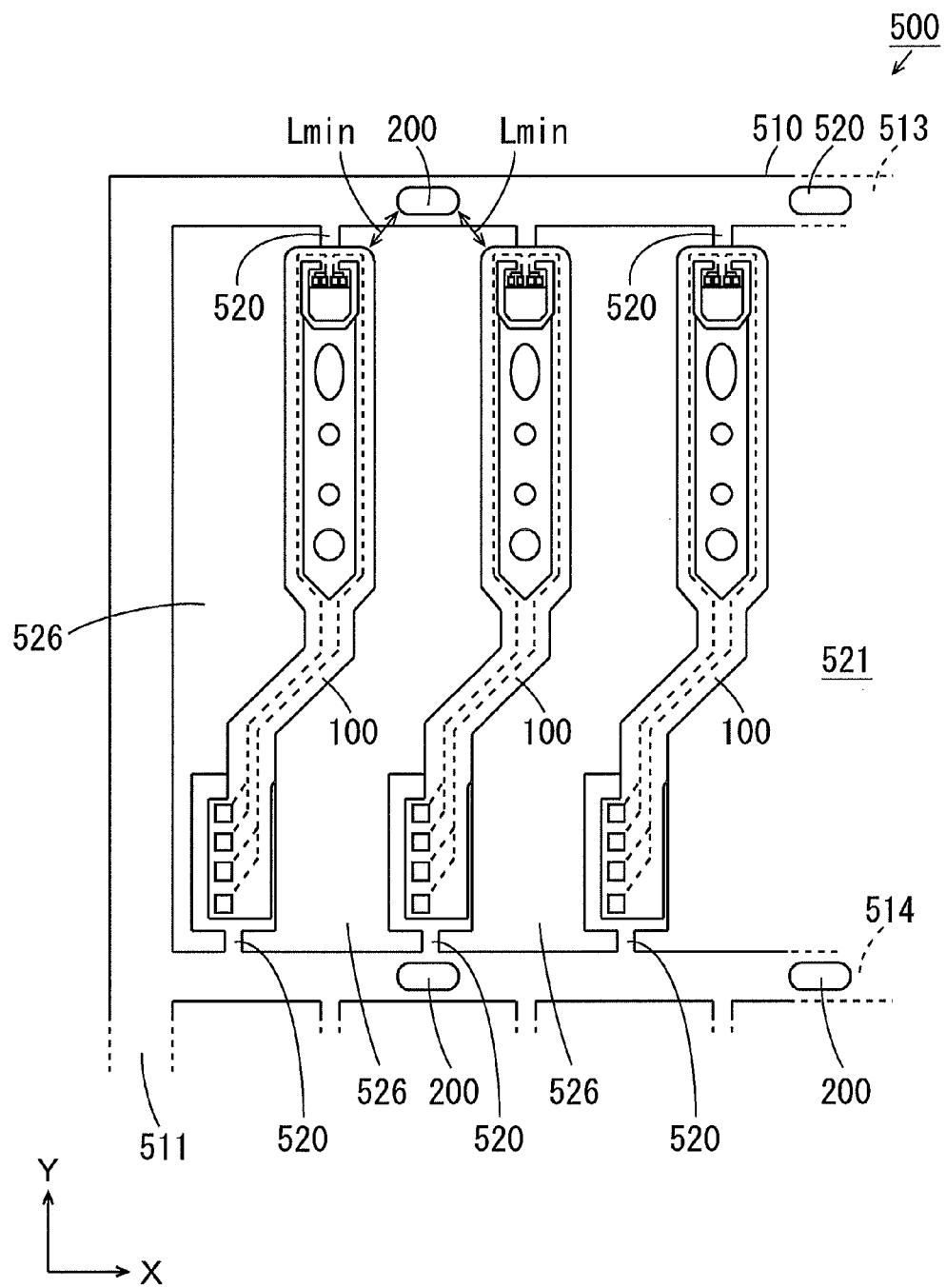
FIG. 16 is a partially enlarged top view of the assembly sheet according to a fifth modified example.

The one inspection substrate 200 may be provided to correspond to two or more than two suspension boards 100. FIG. 16 is a partially enlarged top view of the assembly sheet 500 according to the fifth modified example. In the example of FIG. 16, each two of the suspension boards 100 correspond to the one inspection substrate 200. Specifically, the inspection substrate 200 that corresponds to the one end of each two of the suspension boards 100 in the rectangular region 521 is formed in the end frame 513.

Similarly, the inspection substrate 200 that corresponds to the one end of each two of the suspension boards 100 in the rectangular region 522 is formed in the end frame 514. The inspection substrate 200 that corresponds to the one end of each two of the suspension boards 100 in the rectangular region 523 is formed in the end frame 515. The inspection substrate 200 that corresponds to the one end of each two of the suspension boards 100 in the rectangular region 524 is formed in the end frame 516. The inspection substrate 200 that corresponds to the one end of each two of the suspension boards 100 in the rectangular region 525 is formed in the end frame 517.

(f) Sixth Modified Example

Figure 17A:
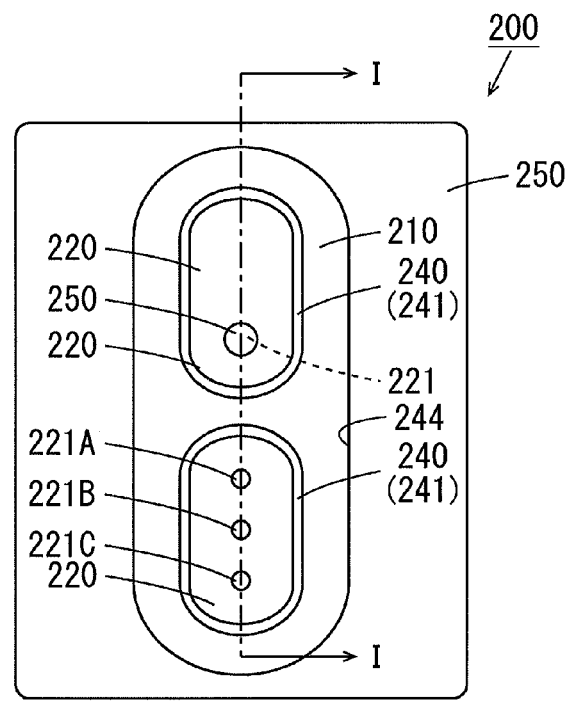
FIGS. 17A and 17B are diagrams showing the configuration of the inspection substrate of the assembly sheet according to a sixth modified example.
Figure 17B:
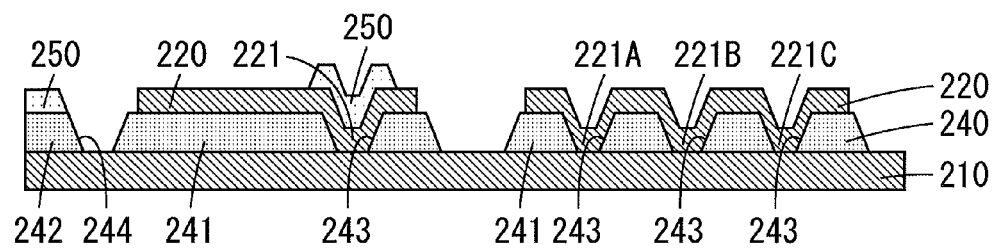

While the one via 221 is provided in the one inspection substrate 200 in the above-mentioned embodiment, the invention is not limited to this. The plurality of types of the vias 221 may be provided in the one inspection substrate 200. FIGS. 17A and 17B are diagrams showing the configuration of the inspection substrate 200 of the assembly sheet 500 according to the sixth modified example. FIG. 17A shows a top view of the inspection substrate 200. FIG. 17B shows a cross sectional view taken along the line I-I of FIG. 17A.

As shown in FIGS. 17A and 17B, in the inspection substrate 200 in the sixth modified example, the one island-shape inner region 241 and another island-shape inner region 241 are formed in the annular opening 244 of the base insulating layer 240. In the one inner region 241, the one via 221 is formed. On the other hand, the plurality of (three in the present example) vias 221A, 221B, 221C are formed in the other inner region 241.

In the present example, a diameter of each of the plurality of vias 221A to 221C of the other inner region 241 is smaller than a diameter of the via 221 of the one inner region 241. The vias 221, 221A to 221C have the configuration and measurements that correspond to the plurality of types of vias (not shown) formed in the suspension board 100, respectively. Thus, the plurality of types of vias of each suspension board 100 can be inspected using the one inspection substrate 200.

As shown in FIGS. 17A and 17B, the plating layer 230 of FIGS. 8A to 8C does not have to be formed on the conductor layer 220. Further, the cover insulating layer 250 does not have to be formed on part of or all of the vias 211, 221A to 221C. In the example of FIGS. 17A and 17B, the cover insulating layer 250 is not formed on each of the vias 221A to 221C.

(8) Effects

In the assembly sheet 500 according to the present embodiment, the plurality of suspension boards 100 are integrally supported by the support frame 510. Further, the plurality of inspection substrates 200 are provided at the support frame 510 to correspond to the plurality of suspension boards 100. Here, the vias 128, 129 of each of the plurality of suspension boards 100 and the via 221 of the inspection substrate 200 have the same configuration.

Thus, the state of each of the vias 128, 129 and the state of the via 221 have a high correlation. Therefore, it is possible to perform the inspection of the vias 128, 129 of each of the plurality of suspension boards 100 in a short period of time and to improve the reliability of the inspection result by performing the inspection of the via 221 of the inspection substrate 200.

In the present embodiment, because the plurality of inspection substrates 200 are provided in the support frame 510, it is not necessary to separately provide a space for arranging the plurality of inspection substrates 200. Further, it is not necessary to provide the coupling portions for supporting the plurality of inspection substrates 200 at the support frame 510. Thus, the configuration of the suspension board 100 is simplified, and the size of the suspension board 100 can be decreased. Further, the inspection of the plurality of inspection substrates 200 can be easily performed simultaneously with the inspection of the resistance values of the plurality of suspension boards 100 by a jig-style inspection device.

Further, in the present embodiment, because a one-to-one correspondence between each of the plurality of suspension boards 100 and each of the plurality of inspection substrates 200 is established, the state of each of the vias 128, 129 can be inspected for each suspension board 100. Thus, the reliability of the inspection result for each suspension board 100 can be improved. Further, because the large number of suspension boards 100 are inspected, the reliability of the inspection result can be more sufficiently improved.

Distances between the plurality of inspection substrates 200 and the plurality of suspension boards 100 that correspond to the plurality of inspection substrates 200, respectively, are equal to each other. In this case, in each of the plurality of suspension boards 100 and each of the plurality of inspection substrates 200, an equal correlation is established between the state of each of the vias 128, 129 and the state of the via 221. Therefore, it is possible to more sufficiently improve the reliability of the inspection results by comparing the inspection results of the plurality of inspection substrates 200 to one another.

Further, in the assembly sheet 500 according to the present embodiment, corrosion of the vias 128, 129 is prevented by the cover insulating layer 180, and corrosion of the via 221 is prevented by the cover insulating layer 250. Thus, a decrease in the correlation over time between the state of the via 221 of the inspection substrate 200 and the state of each of the vias 128, 129 of the plurality of suspension boards 100 can be prevented.

(9) Inventive Examples

As the inventive examples 1 to 8, the assembly sheet 500 having the configuration shown in FIG. 1 was fabricated. The eight inspection substrates 200 included in the assembly sheet 500 were selected, and resistance values of the vias 221 of the selected inspection substrates 200 and resistance values of the vias 128 of the suspension boards 100 that correspond to the selected inspection substrates 200 were measured.

Here, the resistance value of the via 221 of the inspection substrate 200 is a resistance value between the support substrate 210 and the plating layer 230 of FIGS. 8A to 8C, and a resistance value of the via 128 of the suspension board 100 is a resistance value between the support substrate 110 and the connection portion 126 of FIGS. 7A and 7B. The measurement result of the resistance values of the vias 221 of the inspection substrates 200 and the resistance values of the vias 128 of the suspension boards 100 are shown in the Table 1.

TABLE 1

| | INSPECTION SUBSTRATE | SUSPENSION BOARD |
|---|---|---|
| INVENTIVE EXAMPLE 1 | 0.133 Ω | 0.156 Ω |
| INVENTIVE EXAMPLE 2 | 0.169 Ω | 0.174 Ω |
| INVENTIVE EXAMPLE 3 | 0.185 Ω | 0.208 Ω |
| INVENTIVE EXAMPLE 4 | 0.170 Ω | 0.193 Ω |
| INVENTIVE EXAMPLE 5 | 0.181 Ω | 0.175 Ω |
| INVENTIVE EXAMPLE 6 | 0.205 Ω | 0.224 Ω |
| INVENTIVE EXAMPLE 7 | 0.172 Ω | 0.169 Ω |
| INVENTIVE EXAMPLE 8 | 0.288 Ω | 0.295 Ω |

As shown in Table 1, the resistance value of the via 221 of the inspection substrate 200 of the inventive example 1 was 0.133Ω, and the resistance value of the via 128 of the suspension board 100 that corresponds to the inspection substrate 200 of the inventive example 1 was 0.156Ω. The resistance value of the via 221 of the inspection substrate 200 of the inventive example 2 was 0.169Ω, and the resistance value of the via 128 of the suspension board 100 that corresponds the inspection substrate 200 of the inventive example 2 was 0.174Ω.

The resistance value of the via 221 of the inspection substrate 200 of the inventive example 3 was 0.185Ω, and the resistance value of the via 128 of the suspension board 100 that corresponds to the inspection substrate 200 of the inventive example 3 was 0.208Ω. The resistance value of the via 221 of the inspection substrate 200 of the inventive example 4 was 0.170Ω, and the resistance value of the via 128 of the suspension board 100 that corresponds to the inspection substrate 200 of the inventive example 4 was 0.193Ω.

The resistance value of the via 221 of the inspection substrate 200 of the inventive example 5 was 0.181Ω, and the resistance value of the via 128 of the suspension board 100 that corresponds to the inspection substrate 200 of the inventive example 5 was 0.175Ω. The resistance value of the via 221 of the inspection substrate 200 of the inventive example 6 was 0.205Ω, and the resistance value of the via 128 of the suspension board 100 that corresponds to the inspection substrate 200 of the inventive example 6 was 0.224Ω.

The resistance value of the via 221 of the inspection substrate 200 of the inventive example 7 was 0.172Ω, and the resistance value of the via 128 of the suspension board 100 that corresponds to the inspection substrate 200 of the inventive example 7 was 0.169Ω. The resistance value of the via 221 of the inspection substrate 200 of the inventive example 8 was 0.288Ω, and the resistance value of the via 128 of the suspension board 100 that corresponds to the inspection substrate 200 of the inventive example 8 was 0.295Ω.

FIG. 18 is a diagram showing a relation between the resistance value of the via 221 of the inspection substrate 200 and the resistance value of the via 128 of the suspension board 100. In FIG. 18, the abscissa indicates the resistance value of the via 221 of the inspection substrate 200, and the ordinate indicates the resistance value of the via 128 of the suspension board 100.

As shown in FIG. 18, in the inventive examples 1 to 8, the resistance values of the vias 221 of the inspection substrates 200 change substantially linearly depending on a change in the resistance values of the vias 128 of the suspension boards 100. Thus, it was confirmed that the resistance value of the via 221 of the inspection substrate 200 and the resistance value of the via 128 of the suspension board 100 have a high correlation.

(10) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

The assembly sheet 500 is an example of a suspension board assembly sheet with circuits, the support substrates 110, 210 are examples of first and second support substrates, respectively, the base insulating layer 170, 240 are examples of first and second insulating layers, respectively. The write wiring traces 120, 130 are examples of a conductor line, the conductor layer 220 is an example of a conductor layer, the cover insulating layers 180, 250 are examples of third and fourth insulating layers, respectively. The vias 128, 129 are examples of a first via, the via 221 is an example of a second via, the opening 244 is an example of an opening, the support substrate 530 is an example of a support substrate and the base insulating layer 540 is an example of an insulating layer.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for various types of printed circuit boards.

What is claimed is:

1. A suspension board assembly sheet with circuits comprising: a plurality of suspension boards with circuits; a support frame that integrally supports the plurality of suspension boards with circuits; and a plurality of inspection substrates provided to correspond to the plurality of suspension boards with circuits, wherein each of the plurality of suspension boards with circuits includes a conductive first support substrate, a first insulating layer formed on the first support substrate, a conductor line formed on the first insulating layer, and a first via that passes through the first insulating layer and electrically connects the first support substrate and the conductor line, each of the plurality of inspection substrates includes a conductive second support substrate, a second insulating layer formed on the second support substrate, a conductor layer formed on the second insulating layer and a second via that passes through the second insulating layer and electrically connects the second support substrate and the conductor layer, and the first via and the second via have the same configuration, wherein the plurality of suspension boards with circuits further include a third insulating layer formed on the first insulating layer such that at least part of the conductor line and the first via are covered, and the inspection substrate further includes a fourth insulating layer formed on the second insulating layer such that the second via is covered and at least part of the conductor layer is exposed.

2. The suspension board assembly sheet with circuits according to claim 1, wherein
the plurality of inspection substrates are arranged in the support frame.

3. The suspension board assembly sheet with circuits according to claim 1, wherein
the support frame surrounds at least part of the plurality of suspension boards with circuits, and the plurality of inspection substrates are arranged in a region surrounded by the support frame.

4. The suspension board assembly sheet with circuits according to claim 1, wherein
distances between the plurality of inspection substrates and the plurality of suspension boards with circuits that correspond to the plurality of inspection substrates, respectively, are equal to each other.

5. The suspension board assembly sheet with circuits according to claim 1, wherein
a shortest distance between each of the plurality of inspection substrates and the suspension board with a circuit that corresponds to each of the plurality of inspection substrates is not less than 0 μm and not more than 12000 μm.

6. The suspension board assembly sheet with circuits according to claim 1, wherein
the plurality of suspension boards with circuits and the plurality of inspection substrates are provided such that the one or plurality of inspection substrates correspond to each of the plurality of the suspension boards with circuits.

7. The suspension board assembly sheet with circuits according to claim 1, wherein
the second insulating layer has an opening that is formed such that part of the second support substrate is exposed.

8. The suspension board assembly sheet with circuits according to claim 7, wherein
the opening is formed such that a portion having a length of not less than 100 μm of the second support substrate is exposed.

9. The suspension board assembly sheet with circuits according to claim 1, wherein
the fourth insulating layer is formed such that a portion having a length of not less than 100 μm of the conductor layer is exposed.

10. The suspension board assembly sheet with circuits according to claim 1, wherein
the plurality of suspension boards with circuits are supported by the support frame while being arranged in alignment.

* * * * *